United States Patent
Paterson

(10) Patent No.: US 6,697,075 B1
(45) Date of Patent: Feb. 24, 2004

(54) DECODER SYSTEM CAPABLE OF PERFORMING A PLURAL-STAGE PROCESS

(75) Inventor: Kenneth Graham Paterson, Bristol (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/381,010
(22) PCT Filed: Mar. 26, 1998
(86) PCT No.: PCT/GB98/00917
§ 371 (c)(1), (2), (4) Date: Sep. 13, 1999
(87) PCT Pub. No.: WO98/44480
PCT Pub. Date: Oct. 8, 1998

(30) Foreign Application Priority Data

Mar. 27, 1997 (GB) .............................................. 9706457
Jun. 30, 1997 (GB) .............................................. 9713690

(51) Int. Cl.[7] .................................................. G09G 3/36
(52) U.S. Cl. ...................... 345/567; 345/84; 345/564; 345/565; 345/566; 345/568; 345/468; 358/539; 365/230.1; 365/230.04; 365/230.06
(58) Field of Search .............................. 345/660, 567, 345/566, 565, 564, 84, 568; 358/539, 426.01, 426.02, 426.03; 348/468; 365/230.01, 230.04, 230.06

(56) References Cited

U.S. PATENT DOCUMENTS

| | | | |
|---|---|---|---|
| 3,871,003 A | | 3/1975 | Kondo et al. |
| 3,898,616 A | * | 8/1975 | Baugh et al. ............... 340/146 |
| 4,104,735 A | * | 8/1978 | Hofmann et al. ........... 365/230 |
| 5,021,688 A | * | 6/1991 | Leforestier et al. .......... 307/463 |
| 5,034,736 A | | 7/1991 | Bennett et al. |
| 5,122,873 A | * | 6/1992 | Golin ........................ 358/133 |
| 5,278,961 A | | 1/1994 | Mueller |
| 5,369,621 A | * | 11/1994 | Mason .................. 365/230.06 |
| 5,412,614 A | * | 5/1995 | Bird ...................... 365/230.06 |
| 5,430,461 A | | 7/1995 | Tsai |
| 5,592,160 A | * | 1/1997 | Bennett et al. ............... 341/58 |
| 5,640,365 A | * | 6/1997 | Imamiya et al. ............ 365/236 |
| 5,721,709 A | | 2/1998 | Nakamura |

(List continued on next page.)

FOREIGN PATENT DOCUMENTS

JP 8-287686 11/1996

OTHER PUBLICATIONS

Beth, T., *Design Theory*, Cambridge University Press, 1993, pp. 305–346.

(List continued on next page.)

*Primary Examiner*—Matthew Luu
*Assistant Examiner*—Daniel Chang

(57) ABSTRACT

A decoding system which is arranged to perform a plural-stage process in determining which of the driver lines to stimulate in response to each electrode address value supplied to the decoder. This enables the network configuration of the impedances to be machine generated, and also enables the decoder to calculate on the fly which driver lines to stimulate in response to each address value. Furthermore, different resolutions may be provided to enable groups of the electrodes to be addressed simultaneously. Such a decoder arrangement may also be used with an electrode arrangement in which each electrode is connected to only two of the driver lines, in order to achieve addressing schemes in which up to t consecutive electrodes can be driven simultaneously. The invention is applicable, for example, to liquid crystal displays, arrays of memory elements and arrays of sensors such as light-sensors.

22 Claims, 7 Drawing Sheets

U.S. PATENT DOCUMENTS 5,852,469 A * 12/1998 Magai et al. ............... 348/384
6,243,287 B1 * 6/2001 Naffziger et al. ........... 365/154
6,275,442 B1 * 8/2001 Hill et al. ............... 365/230.06

OTHER PUBLICATIONS

Beth, T., *Design Theory*, vol. 2, Cambridge University Press, 1999, pp. 937–939.

Brouwer, A.E., et al., "A New Table of Constant Weight Codes", *IEEE Transactions on Information Theory*, vol. 36, No. 6, Nov. 1990, pp. 1334–1380.

Kobayashi, M., et al., "Electrostatic Recording Method Using Transformer Assemblies Based on Error–Correcting Codes", *IEEE Transactions on Electron Devices*, vol. Ed–25, No.1, Jan. 1978, pp. 1–7.

MacWilliams, F.J., et al., *Theory of Error–Correcting Codes*, 1977, pp. 307–315, 523–531, 683–691.

Minnick, R.C., et al., "Magnetic Core Access Switches", *IRE Transactions on Electronic Computers*, Jun. 1962, pp. 352–368.

Moreno, O., et al., "New Constructions of Optimal Cyclically Permutable Constant Weight Codes", *IEEE Transactions on Information Theory*, vol. 41, No. 2, Mar. 1995, pp. 448–455.

Nguyen, Q.A., et al., "Constructions of Binary Constant–Weight Cyclic Codes and Cyclically Permutable Codes" *IEEE Transactions on Information Theory*, vol. 38, No. 3, May 1992, pp. 940–949.

Singleton, R., "Load–Sharing Core Switches Based on Block Designs", *IRE Transactions on Electronic Computers*, Jun. 1962, pp. 346–352.

* cited by examiner

DECODER SYSTEM CAPABLE OF PERFORMING A PLURAL-STAGE PROCESS

BACKGROUND OF THE INVENTION

1. Field of the Invention

This invention relates to decoder systems and to methods of manufacture of such systems.

The decoder system may be used with an electrode arrangement for an array of electrically-controllable elements, comprising a series of generally parallel electrodes each for extending along a respective line of the electrically-controllable elements, and a series of driver lines for receiving driving signals and supplying them to the electrodes. An electrically-controllable array device may be provided, comprising: first and second such electrode arrangements having their electrodes crossing each other, and an array of electrically-controllable elements each disposed at a crossing of a respective one of the electrodes of the first arrangement and a respective one of the electrodes of the second arrangement. The electrically-controllable elements may, for example, be provided by respective portions of a layer of material sandwiched between the electrodes of the first and second electrode arrangements. The electrically-controllable elements may have a plurality of stable states, and they may be formed by, for example, a bistable ferroelectric liquid crystal material, with the device forming a liquid crystal display panel.

2. Description of Related Art

Such an electrode arrangement is well known, and a conventional ferroelectric liquid crystal display panel having a pair of such electrode arrangements is illustrated in FIG. 1. The display panel 10 comprises lower and upper sheets of glass 12, 14, which sandwich between them a layer of ferroelectric liquid crystal material. At least one of the sheets 12, 14 acts as a plane polarising filter, or has a polarising layer applied to it. The upper surface of the lower sheet 12 is formed with a series of elongate row electrodes 16 oriented in the left-right direction, and the lower surface of the upper sheet 14 is formed with a series of elongate column electrodes 18 oriented in the up-down direction. The electrodes are transparent and formed of, for example, indium-tin-oxide (ITO). The surfaces in contact with the liquid crystal material are treated so as to align the molecules of the liquid crystal material. The portion of the liquid crystal material at each crossing point of a row electrode 16 and a column electrode 18 provides a respective pixel of the display. The ferroelectric liquid crystal material is such that, at each crossing point, if a potential difference having a value greater than a threshold level $V_{T+}$ is applied for a sufficient time between the electrodes 16, 18 at that crossing point, the material will change to a first state, if it is not already in that state, and if an electric field having a value in excess of a threshold level $V_{T-}$, of opposite polarity, is applied for a sufficient time between the electrodes 16, 18, the material will change to a second state, if it is not already in that state. The polarising effect of the crystal on light is different in the first and second states, and in combination with the polarising effect of the sheet(s) 12, 14, causes the pixel to appear black in one of the states and transparent (hereinafter called "white") in the other state.

The row electrodes 16 are each connected to a respective output of a row driver 20, and the column electrodes 18 are each connected to a respective output of a column driver 22. The row and column drivers 20, 22 are controlled by a controller 24, such as a microprocessor. The row and column drivers 20, 22 are each operable to apply voltages to the respective electrodes 16, 18 to cause the pixels to switch to required states so as to form an image on the display panel 10 and to change the image as required. Various driving schemes are known in the art. For example, in one scheme, a voltage $V_{C1}$ is applied by the column driver 22 to all of the column electrodes 18, and a voltage $V_{R1}$ is sequentially applied by the row driver 20 to each of the row electrodes 16, where $V_{C1}-V_{R1}<V_{T-}$, so as to clear the display 10 row-by-row to white. Then, a voltage $V_{R2}$ is sequentially applied by the row driver 20 to the row electrodes 16, and whilst that voltage is being applied to a particular row electrode, a voltage $V_{C2}$ is applied by the column driver 20 to one or more selected column electrodes 18, where $V_{C2}-V_{R2}>V_{T+}$, so as to write black to the pixels at the intersections of that row electrode 16 and the or each selected column electrode 18. In another scheme, rather than clearing the whole display to white and then writing selected pixels to black, the rows are addressed sequentially and all of the pixels in the selected row are cleared to white and immediately afterwards selected pixels in that row are written to black. In a modification to this scheme, rather than addressing the rows sequentially, they are addressed as and when required. In another modification, rather than clearing a whole row of pixels to white and then writing selected pixels to black, pixels which are to be changed from black to white are written to white, and pixels which are to be changed from white to black are written to black.

There is a desire to manufacture such liquid crystal display panels with ever increasing sizes and ever increasing resolutions (decreasing row and column electrodes pitches). In the arrangement shown in FIG. 1, the row and column drivers 20, 22 are fabricated in silicon, and there is a problem in providing proper interconnections between the drivers 20, 22 and the electrodes 16, 18 on the glass sheets 12, 14. It will be appreciated that with increasing sizes and increasing resolutions, the interconnection problem also increases, because the interconnections are greater in number and more closely spaced.

To tackle this problem, each electrode may be connected to a plurality of the driver lines each via a respective impedance, such as a resistor. Such an arrangement is known from patent document U.S. Pat. No. 5,034,736 which describes a driving scheme which is illustrated in FIG. 2 of the accompanying drawings and which will now be briefly described.

In FIG. 2, there are two row drivers 20L, 20R, each of which has three outputs 1, 2, 3 and 4, 5, 6. Output 1 of the left row driver 20L is connected by respective resistors 26 to the left hand ends of row electrodes 16 numbered 1, 4, 7. Output 2 of the left row driver 20L is connected by respective resistors 26 to the left hand ends of row electrodes 2, 5, 8. Output 3 of the left row driver 20L is connected by respective resistors 26 to the left hand ends of row electrodes 3, 6, 9. Output 4 of the right row driver 20R is connected by respective resistors 26 to the right hand ends of row electrodes 1, 5, 9. Output 5 of the right row driver 20R is connected by respective resistors 26 to the right hand ends of row electrodes 2, 6, 7. Output 6 of the right row driver 20R is connected by respective resistors 26 to the right hand ends of row electrodes 3, 4, 8. Furthermore, there are two column drivers 22T, 22B, each of which has three outputs 1, 2, 3 and 4, 5, 6. The top column driver 22T is connected to the upper ends of the column electrodes 18 by respective resistors 26 in a similar fashion to the connection of the left row driver 20L to the left hand ends of the row electrodes 16. Also, the bottom column driver 22B is connected to the lower ends of the column electrodes 18 by respective resistors 26 in a similar fashion to the connection of the right row driver 20R to the right hand ends of the row electrodes 16.

In the example given in U.S. Pat. No. 5,034,736, all of the resistors 26 are of the same value, the drivers 20L, 20R, 22T, 22B can set their output voltages at particular levels, and the liquid crystal material has particular particular positive and negative threshold voltages $V_{T-}$, $V_{T+}$. It will therefore be appreciated that if the voltages applied to the resistors 26 at the opposite ends of a particular electrode 16, 18 are equal, the voltage of that electrode will be the same as the applied voltage. However, if the voltages applied to the resistors 26 of a particular electrode 16, 18 differ, the voltage of that electrode will be the average of the applied voltages. It is therefore possible to drive the electrodes so that a voltage exceeding the threshold voltages $V_{T-}$, $V_{T+}$ can be applied across any selected intersection of the row and column electrodes in order to change the state of the liquid crystal material at that intersection, without applying a voltage in excess of the threshold voltages $V_{T-}$, $V_{T+}$ at any other intersection. The advantage which is provided is that the required total number of outputs from the drivers 22L, 20R, 22T, 22B, and therefore the total number of interconnections between the drivers 22L, 20R, 22T, 22B and the display panel 10, has been reduced from eighteen (in the case of FIG. 1) to twelve (in the case of FIG. 2.)

U.S. Pat. No. 5,034,736 teaches that the arrangement shown in FIG. 2 represents the maximum number of column electrodes and the maximum number of row electrodes which can be activated by the drivers (with the given number of outputs). The prior specification also teaches that the connections permit the drivers to handle a number of electrodes equal to the square of the number of outputs of a driver (that is, nine electrodes for three outputs), which is a much larger number of electrodes than can be handled by drivers in circuitry of the prior art of FIG. 1 where one driver port is assigned to only one electrode. It should be noted, of course, that taking into account the outputs of the driver at the other end of the electrodes, the relationship between the maximum number N of electrodes and the number n of driver outputs for those electrodes envisaged by U.S. Pat. No. 5,034,736 is $N=n^2/4$, rather than $N=n^2$.

Although at first sight the teaching of the prior art might appear to be correct, it is in fact incorrect and places unnecessary restrictions on the interconnect reduction.

BRIEF SUMMARY OF THE INVENTION

The decoder system of the present invention may, for example, be used with an improved electrode arrangement in which the driver lines are so connected to the electrodes such that the driver lines cannot be split into a pair of arbitrary groups of the driver lines for which (a) each group has generally the same number of driver lines and (b) each electrode is so connected to at least one of the driver lines in one of the groups and to at least one of the driver lines in the other of the groups.

Alternatively stated, in such an electrode arrangement the driver lines are so connected to the electrodes such that there is at least one closed circuit from one of the driver line s via at least some of the impedances and at least some of the other driver lines back to said one driver line, the closed circuit including the impedances for an odd number of electrodes.

For example, in a simple example which provides the same degree of discrimination between setting and not setting the state of a pixel, or memory element, as the prior art of U.S. Pat. No. 5,034,736, this improved electrode arrangement enables the relationship between the maximum number N of electrodes and the number n of driver outputs for those electrodes to be $N=n\cdot(n-1)/2$, rather than $N=n^2/4$, and is therefore larger for all but the trivial cases of n=1 and n=2. Thus, the row electrodes 16 of the display panel of FIG. 2 can be driven by five driver outputs, rather than six. Whilst this 16⅔% reduction in the required driver outputs in the case of N=9 may seem small, it is significant. For larger values of N, the improvement becomes more marked. In a practical application where the desired height of a monochrome display might be, say, 210 mm and the resolution might be 300 dpi (electrode pitch of 85 μm), the required number of row electrodes would be N=2480. Applying the teaching of U.S. Pat. No. 5,034,736, the required number of row driver outputs is n=100, whereas with the improved electrode arrangement, the required number of row driver outputs is n=71, that is a 29% reduction. (It can be shown that, in the case where the number N of row electrodes is very large, the maximum reduction, employing only this advance over the prior art, is 100–50√2%, that is about 29.29%.)

U.S. Pat. No. 5,034,736 also teaches that it is essential that the electrodes each have two terminals, a "front terminal" and a "back terminal", to which the respective two resistors are connected, and in all of the examples given in U.S. Pat. No. 5,034,736 these two terminals are at opposite ends of the respective electrode.

In the improved electrode arrangement described herein, each electrode may be connected to at least three of the driver lines, for example three, four, five, six, seven, eight or more of the driver lines.

With this feature, which recognises that the connections to each electrode do not need to be (but can be) made separately and at its two ends, the ratio of the number N of electrodes to the number n of driver lines can be increased considerably. For example, if FIG. 2 is modified so that each row electrode is connected to a different three of the six driver outputs, the number of electrodes can be increased from N=9 to N=20. More generally, for three connections to each electrode, the number N of electrodes which can be driven is related to the cube of the number n of driver lines by $N=n\cdot(n-1)\cdot(n-2)/6$, and so the benefits rise rapidly with n, becoming very marked for large values of n and N. For example, to drive 2480 electrodes, as mentioned above, using three connections per electrode requires 26 driver lines, as compared with 100 driver lines for an arrangement following the teaching of U.S. Pat. No. 5,034,736, that is a 74% reduction in driver lines. With a greater number of connections per electrode, the benefits in the increase of the ratio N/n of the number of electrodes to the number of driver lines becomes even more marked, at least for large values of N.

A problem which is introduced by connecting each electrode to a number c of driver lines greater than two is that the discrimination between selecting and not selecting a particular crossing point of the electrodes becomes more marginal. For example, with an addressing scheme having a clear-to-white phase and a selectively-write-to-black phase, if the voltages provided during the write-to-black phase by each driver line for a column electrode are selectably 0V and $+V_D$, and by each driver line for a row electrode are selectably $-1/4V_D$ and $+3/4V_D$ then with the FIG. 2 arrangement (for which c=2), the voltages which can be applied during that phase to a crossing point are $5/4V_D$, $3/4V_D$, $-1/4V_D$, $-1/4V_D$ and $-3/4V_D$. Assuming that the threshold voltages $V_{T+}$, $V_{T-}$ of the liquid crystal are of equal magnitude ($V_{T+}=-V_{T-}$), then for proper operation they preferably satisfy the relationship $5/4V_D > V_{T+} > 3/4V_D$. In other words, there is a tolerance of $\pm 1/4V_D$ on the threshold voltages. However, if the number c of driver lines connected to each electrode is increased to c=3, and if the voltages provided during the write-to-black phase by each driver line for a column electrode are selectably 0V and $+V_D$, and by each driver line for a row electrode are selectably $-1/6V_D$ and $+5/6V_D$, then the voltages which can be applied during the write-to-black phase to a crossing point are $7/6V_D$, $5/6V_D$, $1/2V_D$, $1/6V_D$, $-1/6V_D$, $-1/2V_D$ and $-5/6V_D$. For proper operation, the threshold voltages preferably satisfy the relationship $7/6V_D > V_{T+} > 5/6V_D$, which therefore places a tighter tolerance of $\pm 1/6V_D$ on the threshold voltages. This ancillary problem is accentuated as the number c of driver lines to which each electrode is connected is increased.

To assist in dealing with this problem, in a preferred form, for any given pair of the electrodes, the number v (if any) of the driver lines to which those electrodes are commonly so connected is at least two less than the number c of the driver lines to which each of those electrodes is so connected. For example, if c is chosen to be four and v is chosen to be two, the arrangement can provide the same degree of "crosstalk" (v/c) as the FIG. 2 arrangement. Although placing this restriction on v causes a reduction in the ratio of N/n, a far greater ratio of N/n can be provided than is envisaged in U.S. Pat. No. 5,034,736. Indeed, it can be shown that for the case where, for example, for c=4 and v=2 (that is v/c=1/2), the improvement is considerable for large values of N, compared with the prior art for which c=2, v=1, and therefore v/c=1/2 also.

For simplicity the electrodes are preferably each so connected to the same number c of the driver lines. Also, for compactness, at least at the positions where the connections for the electrodes are made to the driver lines, the driver lines are preferably oriented generally parallel to each other and generally at right angles to the electrodes and/or the electrodes and the driver lines are preferably disposed on a common substrate.

When the improved electrode arrangement described above is used as one electrode arrangement of a memory and/or display device, the other electrode arrangement may be driven in a conventional manner, or it may also include the improvements.

A first aspect of the invention is concerned with a decoder system which may be used with an electrode arrangement as described above, but which also has other applications. For example, such a decoder system could be used for addressing of arrays of memory elements, or of arrays of sensors such as light sensors, or for mobile communications. More particularly, the first aspect of the invention is concerned with a decoder system comprising: an address input for receiving an address signal representing any of a plurality of address values; a plurality of intermediate nodes (for example the driver lines described above); a decoder responsive to the address signal and arranged to stimulate, for each address value, a respective combination of the intermediate nodes; and a plurality of outputs (for example the connections to the electrodes described above), each responsive to a respective group of the intermediate nodes such that the stimulation applied to that output is dependent upon the stimulation applied by the decoder to each of the intermediate nodes in the respective group.

A decoding system of this type is known from U.S. Pat. No. 5,034,736. In that case, the decoder depends for its operation on a look-up table stored in ROM.

Furthermore, a second aspect of the invention is concerned with a method of manufacturing such a decoder system, comprising the steps of: providing such a decoder which is responsive to an address signal representing any of a plurality of address values and is arranged to stimulate, for each address value, a respective combination of intermediate nodes; providing a plurality of outputs; determining, for each output, a respective group of the intermediate nodes to which that output is to be responsive; and rendering each output responsive to the intermediate nodes in the respective determined group such that the stimulation applied to that output is dependent upon the stimulation applied by the decoder to each of the intermediate nodes in the respective group.

It is difficult in practice to find configurations of connecting the outputs to the intermediate nodes with the necessary properties of a large number N of outputs for a small number n of intermediate nodes, and a small ratio of v/c. Combinatorial searching may be used, but requires careful optimisation, and even then begins to become inefficient in terms of computation time as the number n of intermediate nodes increases, because of the extremely large search space. Fortunately, such lengthy searching is only needed when designing the decoding system, and the generated solution can be stored in a look-up table for subsequent implementation. However, the need for a look-up table has cost implications, and a method which obviates the need for a look-up table (or a large look-up table) would be preferable.

The first and second aspects of the invention have evolved from a realisation that certain mathematical constructive methods may be found for generating mappings between the address values and the intermediate node stimulation patterns and accordingly mappings between the intermediate nodes and the outputs, and that such constructive methods may be applied with specific choices of parameters to obtain specific configurations. Examples of such constructive methods which have been found include those based on affine geometries, projective geometries, concatenation and difference families. These constructive methods employ a plural-stage process, rather than a single-stage process which is used in obtaining a value or a set of values from a look-up table.

Accordingly, the method of the second aspect of the invention is characterised by the steps of: determining a plural-stage process to be performed by a decoder, said plural-stage process comprising at least a first stage in which results are determined and a second stage for which the results of the first stage are provided as inputs; arranging the decoder to perform the determined plural-stage process in determining which of the intermediate nodes to stimulate in response to each address value; and using the determined plural-stage process in said step of determining the group of the intermediate nodes to which the outputs are to be responsive.

Furthermore, the decoder system of the first aspect of the invention is characterised in that: the decoder is arranged to perform a plural-stage process in determining which of the intermediate nodes to stimulate in response to each address value, said plural-stage process comprising at least a first stage in which results are determined and a second stage for which the results of the first stage are provided as inputs.

As will be appreciated from the following description, it is therefore possible to employ relatively simple hard-wired circuitry or a computer performing a relatively simple programme, rather than using a single look-up table which, in the case of a display having several thousand electrodes, would be of considerable size.

In the context of this specification, the term "plural-stage process" is intended to include a process in which the result(s) of at least one first stage of the process is/are applied to at least one further stage of the process. For example, in one embodiment of the invention to be described in detail below: components of the process input are supplied to four pairs of first-stage elements (which may be look-up tables or logic arrays); the outputs of the first stage elements are supplied to four pairs of second-stage elements (which again may be look-up tables or logic arrays); the outputs of the second stage elements and components of the process input are applied to four pairs of third-stage elements (which again may be look-up tables or logic arrays); and the outputs of the third stage elements are applied to four $2^6$-to-64 decoding devices in order to provide the decoder output. More generally, a plural-stage process includes a process performed by several layers of basic elements (such as look-up tables, gates and arithmetic elements) in which the output of at least one of the layers feeds into a subsequent layer. In another embodiment of the invention, corresponding stages of the process are performed by a programmed computer. In the context of this specification, the term "plural-stage process" does not include the processes performed by, for example, a simple logic gate (such as an AND or OR gate), a simple arithmetic unit (such as an adder or a multiplier), or a look-up table. Also, a plurality of processes which are performed independently of each other do not constitute a plural-stage process for the purposes of this specification.

Preferably, the system includes a resolution input for receiving a resolution signal representing any of a plurality of resolution values, and the decoder is responsive to the resolution signal such that: when the resolution signal has a first value, the combination of intermediate nodes stimulated in response to each address value causes a first number of the outputs to be stimulated, or to be stimulated beyond a predetermined threshold; and when the resolution signal has a second value, the combination of intermediate nodes stimulated in response to each address value causes a group of a second number of the outputs, greater than said first number, to be stimulated, or to be stimulated beyond the threshold.

Accordingly, in the case where the decoder system is used with a display, it is possible to stimulate a plurality of the display lines simultaneously, a property sometimes referred to later in this specification as "multi-line addressing". Moreover, it can be achieved that the stimulation applied to each of the desired display lines is above a certain threshold, whilst the stimulation applied to each of the remaining display lines is below a lower threshold.

Preferably, the decoder is responsive to the resolution signal such that when the resolution signal has at least one further value, the combination of intermediate nodes stimulated in response to each address value causes a, or a respective, group of a further number of the outputs to be stimulated, or to be stimulated beyond the threshold, the or each further different number being greater than the first number or the second number. In one advantageous approach, the further different number can be an integral multiple of the second number, in which case it is advantageous that each group, when the resolution signal has said one further value, is a union of a predetermined number of the groups when the resolution signal has said second value.

An alternative is that the further different number is an integral multiple of the first number. Preferably, the arrangement is such that the outputs which are so stimulated in response to each address value when the resolution signal has said second value are physically grouped adjacent each other. Accordingly, in the case of a display, it is possible to stimulate blocks of lines of the display simultaneously, and the block stimulation may be hierarchically arranged.

BRIEF DESCRIPTION OF THE DRAWINGS

Specific embodiments of the present invention will now be described by way of example with reference to the accompanying drawings. In the drawings.

Figure 1:
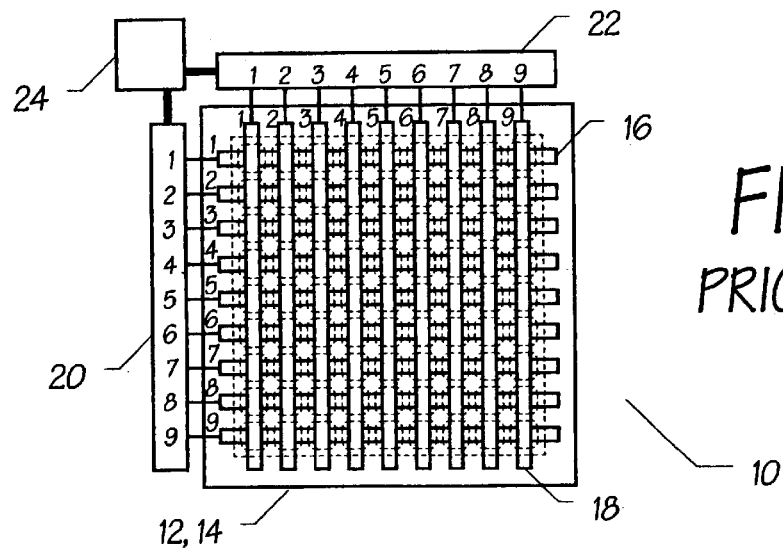
FIG. 1 illustrates a conventional driving scheme for a liquid crystal display panel.

The embodiments of the invention which will be described below employ the techniques already described above with reference to FIGS. 1 and 2, except where otherwise stated or where the context so requires.

DETAILED DESCRIPTION OF THE INVENTION

Figure 2:
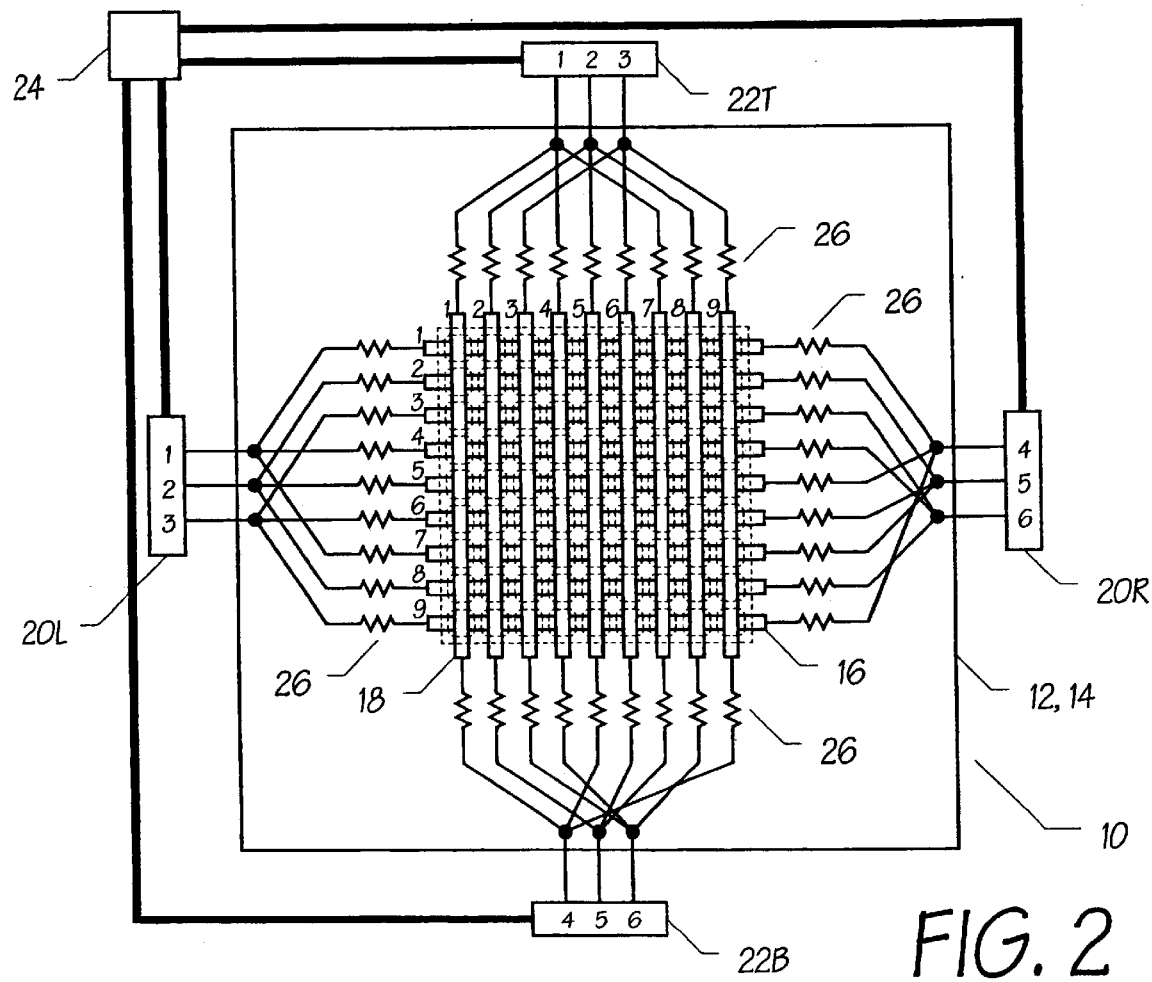
FIG. 2 illustrates a driving scheme for a liquid crystal display panel as described in U.S. Pat. No. 5,034,736.
Figure 3:
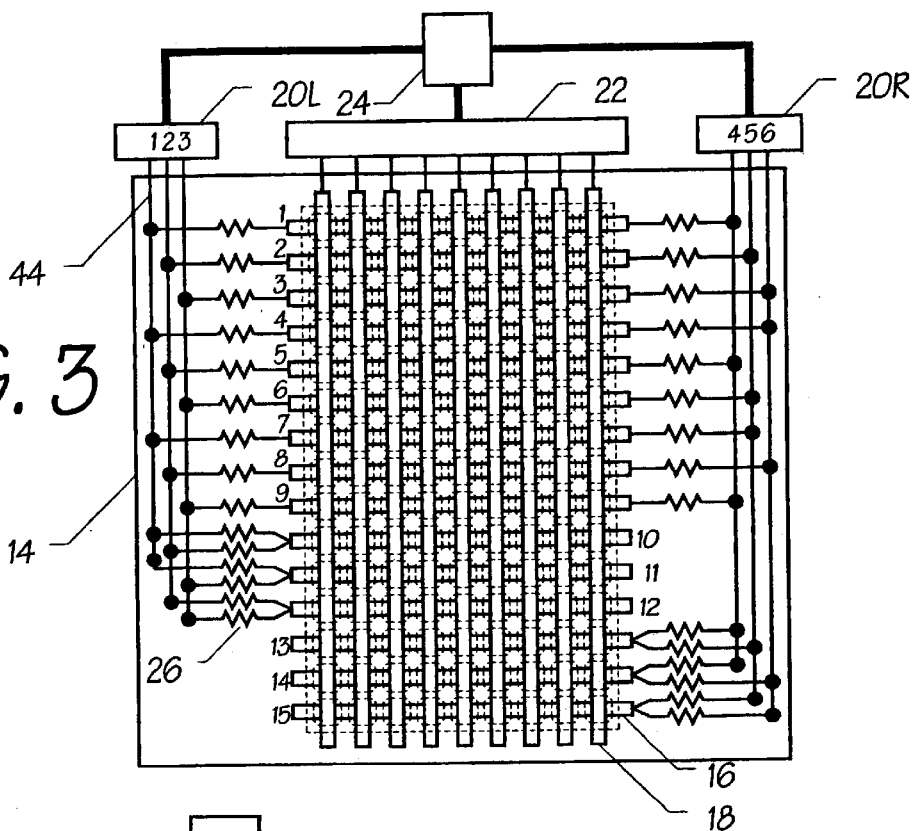
FIG. 3 illustrates a liquid crystal display panel employing an embodiment of electrode arrangement in accordance with the first aspect of the present invention.

In the embodiment of FIG. 3, the column electrodes 18 are connected to the column driver 22 and driven by it in a similar fashion to that described above with reference to FIG. 1. The upper nine row electrodes 16 are connected to the row drivers 20L, 20R, in a fashion which is connection-wise equivalent to that described above with reference to FIG. 2. However, six additional row electrodes, numbered 10 to 15 are provided. The row electrodes numbered 10 to 12 are connected by pairs of resistors 26 to different permutations of the outputs 1, 2, 3 of the row driver 20L, and the row electrodes numbered 13 to 15 are connected by pairs of resistors 26 to different permutations of the outputs 4, 5, 6 of the row driver 20R. This embodiment of the invention therefore removes the limitation of U.S. Pat. No. 5,034,736 that each electrode must be connected to both row drivers 20L, 20R and therefore enables further row electrodes to be provided without requiring any further driver outputs.

Figure 4:
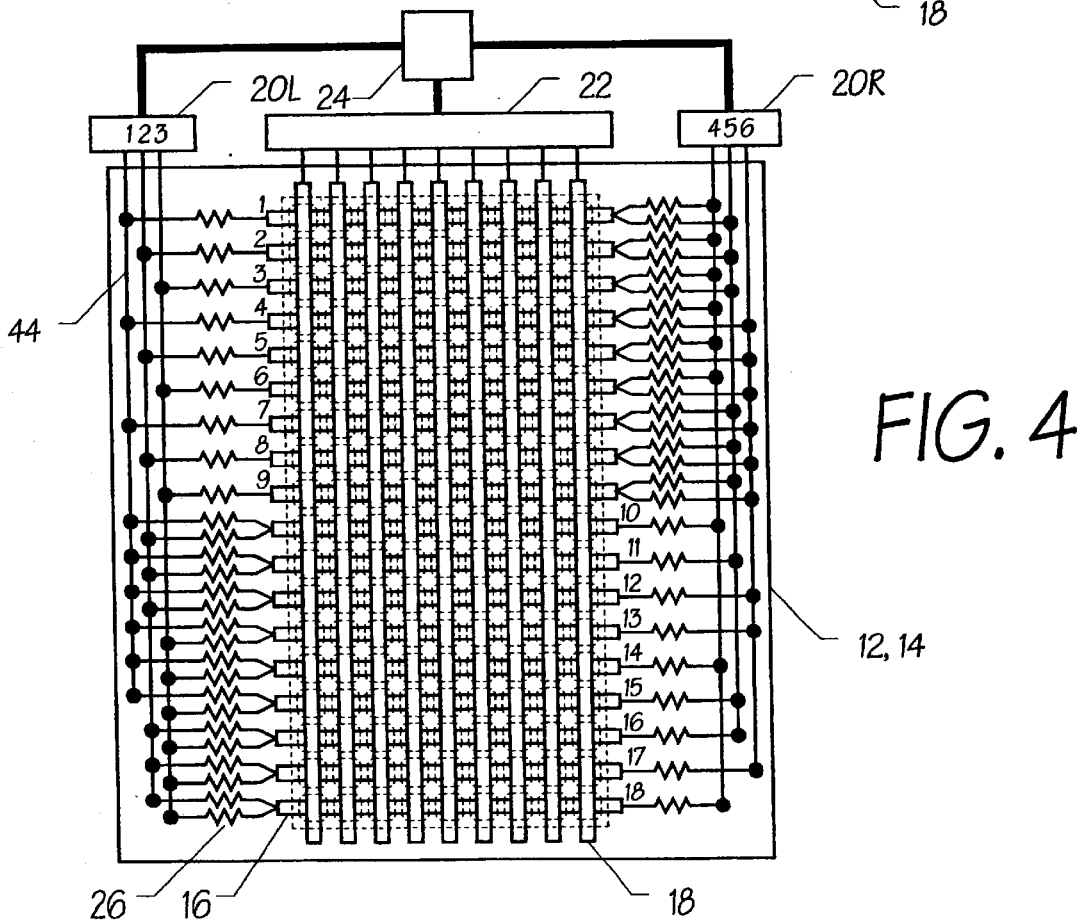
FIG. 4 illustrates a liquid crystal display panel employing an embodiment of electrode arrangement in accordance with the second aspect of the present invention.

In the embodiment of FIG. 4, the column electrodes 18 are again connected to the column driver 22 and driven by it in a similar fashion to that described above with reference to FIG. 1. The upper nine row electrodes 16 numbered 1 to 9 are connected to the row driver 20L in a fashion which is connection-wise equivalent to that described above with reference to FIG. 2. The upper nine row electrodes 16 numbered 1 to 9 are also connected to the row driver 20R, but each of these electrodes is connected by a respective pair of resistors 26 to different permutations of the outputs 4, 5, 6 of the row driver 20R. The embodiment of FIG. 4 has a further nine row electrodes 16, numbered 10 to 18, which are connected to the row driver 20R in a fashion which is connection-wise equivalent to that described above with reference to FIG. 2. These row electrodes are also connected to the row driver 20L, but each is connected by a respective pair of resistors 26 to different permutations of the outputs 1, 2, 3 of the row driver 20L. This embodiment of the invention therefore removes the limitation of U.S. Pat. No. 5,034,736 that each electrode has only two connections to the row drivers 20L, 20R and, as with the embodiment of FIG. 3, enables further row electrodes to be provided without requiring any further driver outputs.

Figure 5:
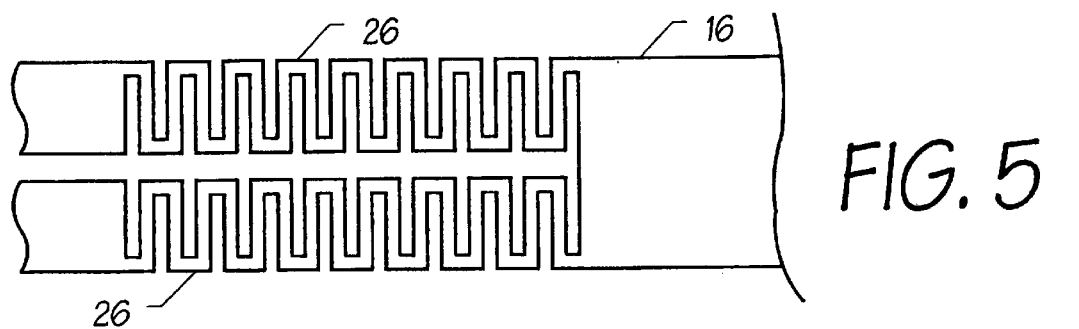
FIG. 5 is a plan view on a larger scale of part of the display panels of FIGS. 3 and 4 illustrating one way in which the resistors may be formed.

As described above, the electrodes 16, 18 may be formed of indium-tin-oxide (ITO). The resistors 26 may be provided by thinned portions of the electrode material. For example, FIG. 5 illustrates the left-hand end of the row electrode 16 numbered 10 in FIG. 3, which is connected by two resistors 26 to the driver lines 1, 2 of the left row driver 20L. The electrode 16 and resistors 26 are formed by depositing the ITO on the glass substrate, and the resistors 26 are provided by portions of the ITO which are significantly narrower than the width of the electrodes and follow a serpentine path, the required resistance been provided by the resistivity of the ITO. In an alternative arrangement, the ITO may be deposited on the glass substrate with a gap in the ITO, and then a further material of higher resistivity may be deposited over the gap so as to bridge the gap and provide the resistor 26.

Figure 6:
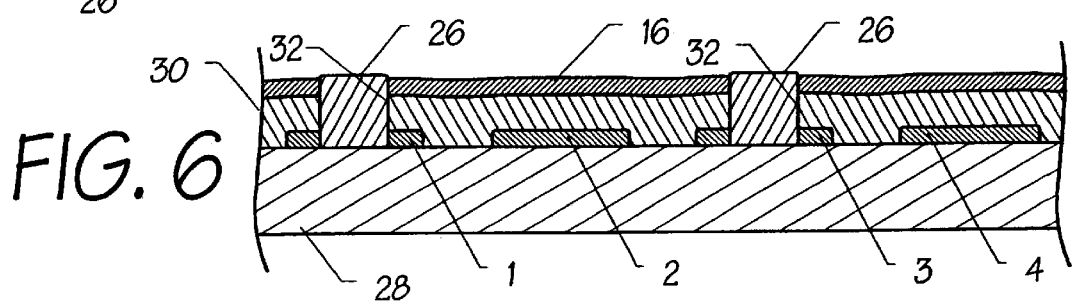
FIG. 6 is a cross-sectional view on a larger scale through part of a display panel illustrating another way in which the resistors may be formed.

In yet another arrangement, as shown in FIG. 6, the material of the driver lines 1, 2, 3 from the driver 20L (or the driver lines 4, 5, 6 from the driver 20R) is deposited on the glass substrate 28. Then, an insulating layer 30 is deposited over the driver lines, and then the electrodes 16 are deposited on the arrangement so as to cross the driver lines. At a location where an electrode 16 is to be connected to a driver line, a via 32 is formed through the electrode 16, the insulating layer 30 and the driver line. An electrically resistive material is then deposited in the via 32 so as to form a resistor 26 of the appropriate value interconnecting the electrode and the driver line. It will therefore be appreciated that in the case of an electrode which is to be connected to two or more of the driver lines, the connections can be aligned with the longitudinal axis of the electrode, as shown in FIG. 7, in which the small crosses denote resistive connections of the type described with reference to FIG. 6.

In one modification to the FIG. 6 arrangement, the vias do not penetrate the driver lines, and the resistive material is deposited on top of the driver lines. In another alternative or additional modification, the vias are formed before the electrodes are deposited; the resistive material is deposited in the vias preferably so that it protrudes slightly above the insulating layer; and then the electrodes are deposited over the insulating layer and the resistive material.

Figure 7:
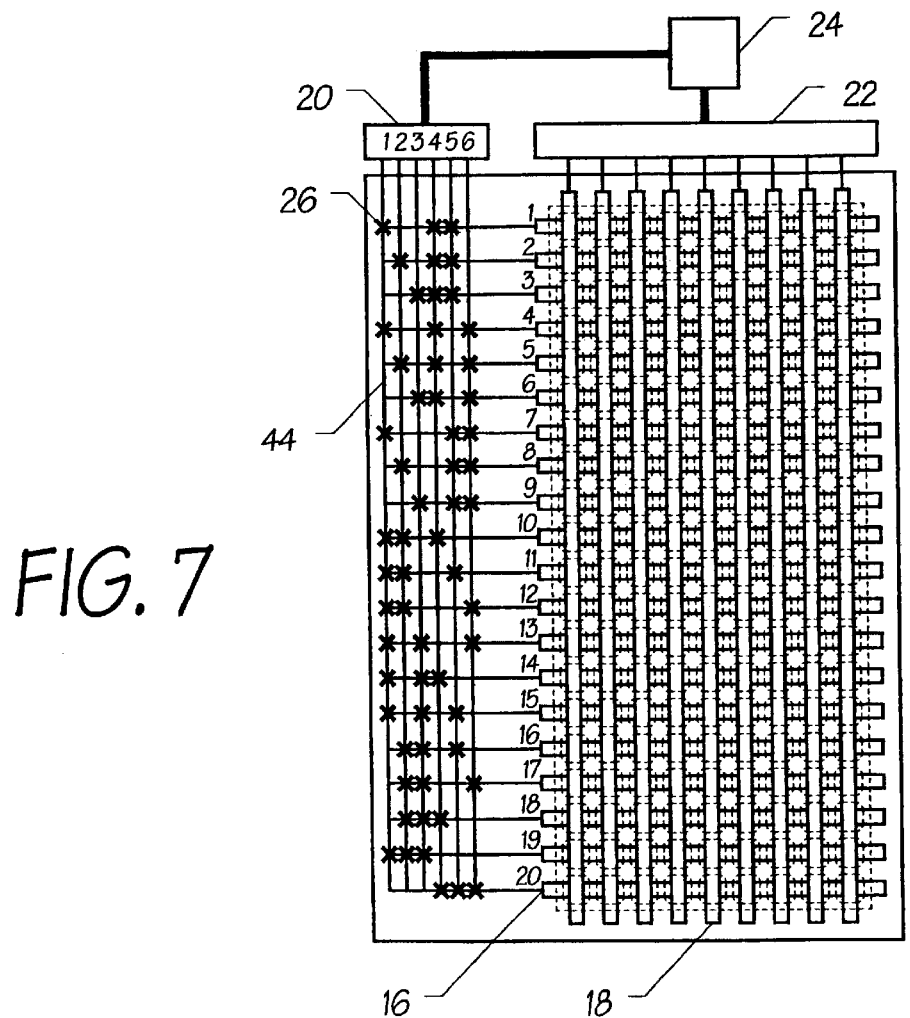
FIGS. 7–9 illustrate liquid crystal display panels employing embodiments of electrode arrangements in accordance with both the first and second aspects of the present invention.

In the embodiment of FIG. 7, the row electrode driver is shown as a single unit 20, having six driver lines numbered 1 to 6. Also, all of the connections to the row electrodes 16 are made at the left-hand ends of the electrodes, and the resistors 26 are of the type described above with reference to FIG. 6. The row driver lines are connected to eighteen row electrodes numbered 1 to 18 in a manner which is connection-wise similar to that of the embodiment of FIG. 4. However, two further row electrodes numbered 19, 20 are provided, with electrode numbered 19 connected via resistors 26 to the driver lines 1, 2 and 3 of the row driver 20, and with the electrode numbered 20 connected via resistors 26 to the driver lines 4, 5 and 6 of the row driver. This embodiment of the invention therefore removes both limitations of U.S. Pat. No. 5,034,736 described above with reference to FIGS. 3 and 4, allowing even more row electrodes 16 to be provided without requiring any further driver outputs.

The embodiments of the invention shown in FIGS. 4 and 7 have three connections made to each row electrode, that is, $c=3$. As discussed in the introduction, this places a tighter restriction on the tolerance of the threshold voltages of the liquid crystal material. An important parameter in considering this problem, which will be termed the overlap v, is the maximum, for any pair of the electrodes, of the number of the driver lines to which those electrodes are commonly connected. Another important parameter is the ratio $v/c$ which relates to the crosstalk of the electrode arrangement. In the prior art of FIG. 1, there is no overlap and so $v/c=0$. In the prior art of FIG. 2 and in the embodiment of FIG. 3, $c=2$, $v=1$, and $v/c=1/2$ which means that crosstalk may be a problem, but with modern materials and manufacturing techniques is not a serious problem. In the embodiments of FIGS. 4 and 7, $c=3$, $v=2$, and $v/c=2/3$, which means that crosstalk is even more of a problem, requiring higher quality materials and more precise manufacturing techniques. In order to reduce the crosstalk ratio $v/c$, it is possible to reduce v by not employing all of the possible permutations of connections of the electrodes to the driver lines. The interesting point which has arisen from the research carried out in making this invention is that, for the same crosstalk ratio $v/c$, but for higher v and c, the ratio of the possible number N electrodes to the required number n of driver lines increases, especially for large values of N.

Figure 8:
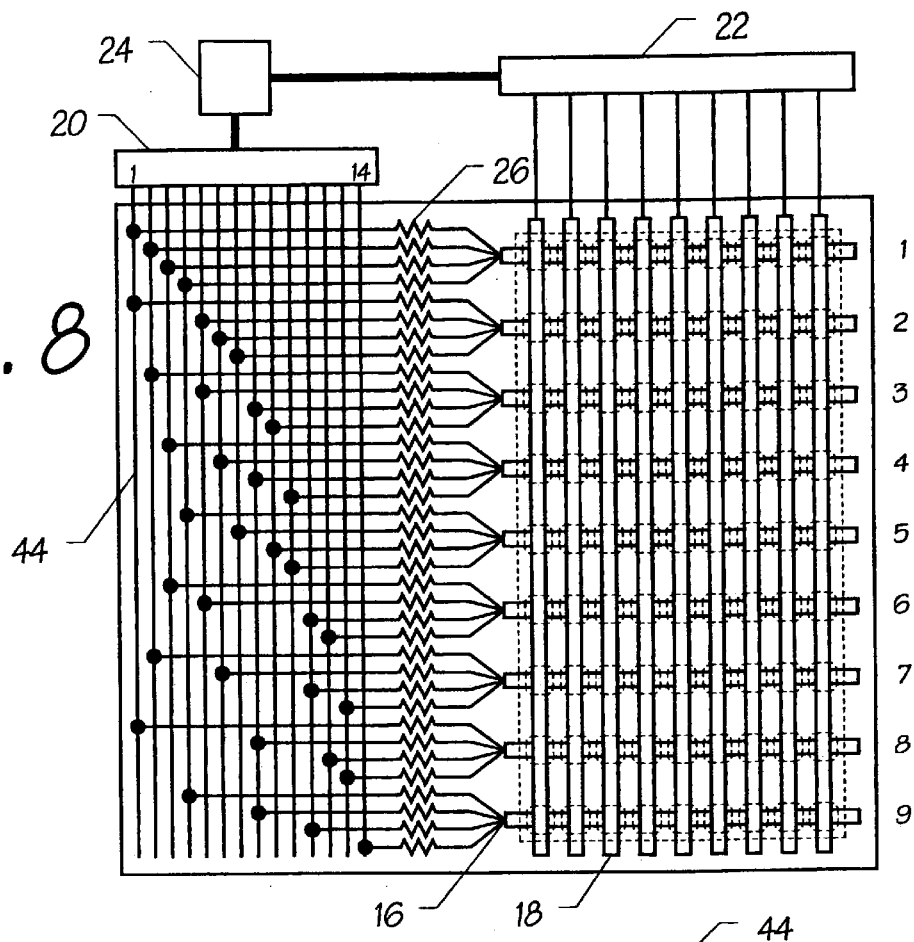

FIG. 8 illustrates an embodiment of the invention in which $c=4$, $v=1$, and $v/c=1/4$, that is with half the crosstalk ratio as the prior art of FIG. 2 and the embodiment of FIG. 3. As can be seen in FIG. 8, the row driver 20 drives fourteen driver lines, and there are nine row electrodes 16 each of which is connected to a combination of four of the driver lines. The combinations of the connections are such that no pair of the electrodes 16 have more than one driver line in common.

As mentioned above, the advantages provided by this feature become of great significance when the number N of electrodes is large, and the benefits are not particularly apparent from FIG. 8, which, because of the space available, shows a case in which there are only nine electrodes. However, the advantages of this feature will be apparent from the following table which demonstrates a possible arrangement of connections between the driver lines and the row electrodes in a further case. In this case the number n of driver lines is 16, the number c of connections to each electrode is 4, and no two electrodes have more than two connections in common (v=2), and therefore v/c=1/2: the same crosstalk ratio as the prior art of FIG. 2. As can be seen from the following Table 1, the possible number N of electrodes is 140, and therefore the ratio N/n=8.75. By comparison, following the teaching of U.S. Pat. No. 5,034,736, sixteen row driver lines would drive only sixty-four row electrodes, giving a ratio N/n=4, for the same crosstalk value v/c=1/2.

TABLE 1

| Electrode | Driver line connections 1–16 (● = connected, ○ = not connected) | Electrode | Driver line connections 1–16 (● = connected, ○ = not connected) |
|---|---|---|---|
| 1  | ●●●●○○○○○○○○○○○○ | 2  | ●●○○●●○○○○○○○○○○ |
| 3  | ○○●●●●○○○○○○○○○○ | 4  | ●○●○●○●○○○○○○○○○ |
| 5  | ○●○●●○●○○○○○○○○○ | 6  | ○●●○○●●○○○○○○○○○ |
| 7  | ●○○●○●●○○○○○○○○○ | 8  | ○●●○●○○●○○○○○○○○ |
| 9  | ●○○●●○○●○○○○○○○○ | 10 | ●○●○○●○●○○○○○○○○ |
| 11 | ○●○●○●○●○○○○○○○○ | 12 | ●●○○○○●●○○○○○○○○ |
| 13 | ○○●●○○●●○○○○○○○○ | 14 | ○○○○●●●●○○○○○○○○ |
| 15 | ●●○○○○○●●○○○○○○○ | 16 | ○○●●○○○○●●○○○○○○ |
| 17 | ○○○○●●○○●●○○○○○○ | 18 | ○○○○○●●●●○○○○○○○ |
| 19 | ●○●○○○○○●○●○○○○○ | 20 | ○●○○○○○●○●○●○○○○ |
| 21 | ○○○○●○●○●○●○○○○○ | 22 | ○○○○○●○●●○●○○○○○ |
| 23 | ○●○○○○○○●●○●○○○○ | 24 | ●○○●○○○○○●○○●○○○ |
| 25 | ○○○○○●●○○●○●○○○○ | 26 | ○○○○●○○●○○●○●○○○ |
| 27 | ○●●○○○○●○○●○●○○○ | 28 | ●○○●○○○●○○●○○○○○ |
| 29 | ○○○○●●○●○○●○○○○○ | 30 | ○○○○○●○○●●○●○○○○ |
| 31 | ●○●○○○○○●○●○○○○○ | 32 | ○●○○○○○○●○●○●○○○ |
| 33 | ○○○○●○●○○●○●○○○○ | 34 | ○○○○○●○●○●○●○○○○ |
| 35 | ●●○○○○○○○●●○○○○○ | 36 | ○○●●○○○○○○●●○○○○ |
| 37 | ○○○○●●○○○○●●○○○○ | 38 | ○○○○○○●●○○●●○○○○ |
| 39 | ○○○○○○○○●●●●○○○○ | 40 | ●○○○●○○○●○○○●○○○ |
| 41 | ○●○○○●○○●○○○●○○○ | 42 | ○○●○○○●○○○●○○●○○ |
| 43 | ○○○●○○○●○○○●○○●○ | 44 | ○●○○●○○○●○○●○○○○ |
| 45 | ●○○○○●○○○●○○●○○○ | 46 | ○○○●○○●○●○○●○○○○ |
| 47 | ○○●○○○○●○●○○●○○○ | 48 | ○○●○○○○●○○●○●○○○ |
| 49 | ○○○○●○○○○●○●○●○○ | 50 | ●○○○○○●○○○●○●○○○ |
| 51 | ○●○○○○○○●○○●○●○○ | 52 | ○○○●●○○○○○○●●○○○ |
| 53 | ○○●○○●○○○○○●●○○○ | 54 | ○●○○○○●○○●○○○●○○ |
| 55 | ●○○○○○○●○●○●○○○○ | 56 | ○●○○●○○○●○○○○●○○ |
| 57 | ●○○○○●○○●○○○●○○○ | 58 | ○○○●○○●○●○○○○●○○ |
| 59 | ○○●○○○○●●○○○○●○○ | 60 | ●○○○●○○○○●○○○●○○ |
| 61 | ○●○○●○○○●○○○○●○○ | 62 | ○○●○○○●○○●○○○●○○ |
| 63 | ○○○●○○○●○○●○○●○○ | 64 | ○○○●●○○○○○●○○●○○ |
| 65 | ○○●○●○○○○●○○●○○○ | 66 | ○●○○○○○●○○○●○●○○ |
| 67 | ●○○○●○○○○○●○○●○○ | 68 | ○○●○○○○○○●○○○●●○ |
| 69 | ○○○●○○●○○○○●○●○○ | 70 | ●○○○○○○○○○●○●●○○ |
| 71 | ○●○○○○●○○●○○○○●○ | 72 | ●●○○○○○○○○○○●●○○ |
| 73 | ○○●●○○○○○○○●○●○○ | 74 | ○○○●●○○○○○○○●●○○ |
| 75 | ○○○○○●●○○○○●○●○○ | 76 | ○○○○○○●○○●○○●●○○ |
| 77 | ○○○○○○○○●●●○○●○○ | 78 | ○○●○●○○●○○○○○●○○ |
| 79 | ○○○●○○●○○○○○○○●○ | 80 | ●○○○○○○●○○○○○○●○ |
| 81 | ○●○○○○○●●○○○○○●○ | 82 | ○○○●●○○○○○●○○○●○ |
| 83 | ○○●○○●○○○●○○○○●○ | 84 | ○●○○○○●○○●○○○○●○ |

TABLE 1-continued

| | | | |
|---|---|---|---|
| 85 | ●○○○○○○●○●○○○○●○ | 86 | ●○○○●○○○○○●○○○●○ |
| 87 | ○●○○○●○○○○●○○○●○ | 88 | ○○●○○○●○○○●○○○●○ |
| 89 | ○○○●○○○●○●○○○○●○ | 90 | ○●○○●○○○○○○●○○●○ |
| 91 | ●○○○○●○○○○○●○○●○ | 92 | ○○○●○○●○○○○●○○●○ |
| 93 | ○○●○○○○●○○○●○○●○ | 94 | ●○●○○○○○○○○○●○●○ |
| 95 | ○●○●○○○○○○○○●○●○ | 96 | ○○○○●○●○○○○○●○●○ |
| 97 | ○○○○○●○●○○○○●○●○ | 98 | ○○○○○○○○●○●○●○●○ |
| 99 | ○○○○○○○○●○●●○○●○ | 100 | ○●●○○○○○○○○○○●●○ |
| 101 | ●○○●○○○○○○○○○●●○ | 102 | ○○○○●●○○○○○○○●●○ |
| 103 | ○○○○●○○●○○○○○●●○ | 104 | ○○○○○○○○○●●○○●●○ |
| 105 | ○○○○○○○●○○●○●●○ | 106 | ○○○●○○○○●○○○○○○● |
| 107 | ○○●○○●○○●○○○○○○● | 108 | ○●○○○○●○●○○○○○○● |
| 109 | ●○○○○○○●●○○○○○○● | 110 | ○○●○●○○○○●○○○○○● |
| 111 | ○○○●○●○○○●○○○○○● | 112 | ●○○○○○●○○○●○○○○● |
| 113 | ○●○○○○○●○●○○○○○● | 114 | ○●○○●○○○○○●○○○○● |
| 115 | ●○○○●○○○○●○○○○○● | 116 | ○○○●○○●○○○○●○○○● |
| 117 | ○○●○○○○●○○○●○○○● | 118 | ●○○○○●○○○●○○○○○● |
| 119 | ○●○○○●○○○○○●○○○● | 120 | ○○●○○○○●○○○●○○○● |
| 121 | ○○○●○○○●○○○●○○○● | 122 | ○●●○○○○○○○○○●○○● |
| 123 | ●○○●○○○○○○○●○○● | 124 | ○○○○○●●○○○○○●○○● |
| 125 | ○○○○●○○○●○○○●○○● | 126 | ○○○○○○○○○●●○●○○● |
| 127 | ○○○○○○○●○●○○●○○● | 128 | ●○●○○○○○○○○○○●○● |
| 129 | ○●○●○○○○○○○○●○○● | 130 | ○○○○●○●○○○○○○●○● |
| 131 | ○○○○○●○●○○○○○●○● | 132 | ○○○○○○○●○●○○●○● |
| 133 | ○○○○○○○○●○●○●○● | 134 | ●●○○○○○○○○○○○○●● |
| 135 | ○○●●○○○○○○○○○●● | 136 | ○○○○●●○○○○○○○○●● |
| 137 | ○○○○○○●●○○○○○○●● | 138 | ○○○○○○○●●○○○○○●● |
| 139 | ○○○○○○○○○●●○○●● | 140 | ○○○○○○○○○○○○●●● |

Table 1 can be considered as a list of activation patterns for each electrode, an activation pattern for a given electrode being the combination of c driver line connections required to activate the electrode (by providing it with at least a threshold voltage).

As an illustrative comparison, the following Table 2 gives examples of the number N of electrodes which are possible for various numbers n of the driver lines in the cases of (a) an arrangement following the teaching of U.S. Pat. No. 5,034,736 for which c=2, v=1 and therefore v/c=1/2 (see FIG. 2), (b) an embodiment of the invention for which c=3, v=2 and therefore v/c=2/3 (see FIG. 7), and (c) an embodiment of the invention for which c=4, v=2 and therefore v/c=1/2 (see Table 1 for the n=16 case).

TABLE 2

| Number "n" of | Number "N" of Electrodes | | |
|---|---|---|---|
| | US-A-5034736 | Embodiments of Invention | |
| Driver Lines | c = 2, v = 1 v/c = 1/2 | c = 3, v = 2 v/c = 2/3 | c = 4, v = 2 v/c = 1/2 |
| 4 | 4 | 3 | 1 |
| 8 | 16 | 56 | 14 |
| 16 | 64 | 560 | 140 |
| 32 | 256 | 4960 | 1240 |
| 64 | 1024 | 41664 | 10416 |

(Although the values of n given in Table 2 are powers of two, there is no restriction on n being a power of two.)

As can be seen, the embodiments of the invention enable a far larger number N of electrodes to be used (unless the number of driver lines n is small), even in the case where v/c is 1/2.

Figure 9:
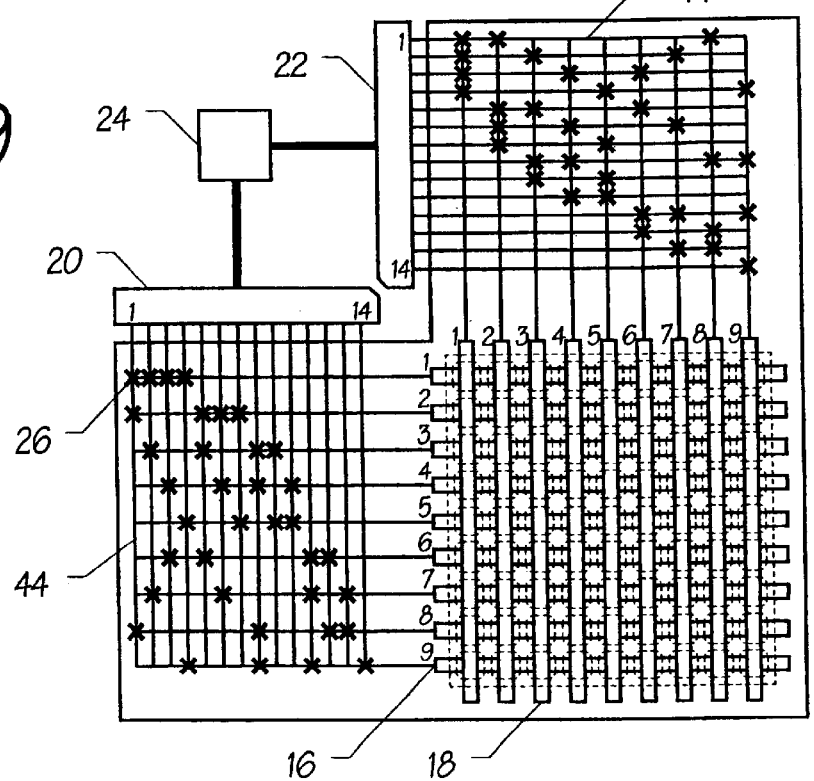

In the embodiments described above with reference to FIGS. 3 to 8, the invention has been applied to the row electrodes 16. It will be appreciated that the invention may alternatively or additionally (as shown in FIG. 9) be applied to the column electrodes 18. In particular, in the case of a display which has a width greater than its height, the invention may in many cases provide greater benefit when applied to the column electrodes 18. Also, in the case of a colour display in which the column electrodes are sequentially arranged to drive red, green and blue sub-pixels, the invention may provide great benefit when applied to the column electrodes. If the invention is applied to the row electrodes and the column electrodes, then the combined crosstalk of the row and column electrodes needs to be taken into account in relation to the threshold tolerance of the liquid crystal material.

It should be noted that in the embodiments of the invention described above with reference to FIGS. 3, 4 and 7 to 9, the driver lines to which the invention is applied extend generally parallel to each other at the edge of the display and generally at right angles to the respective electrodes. Especially in the case of a display with a large number of electrodes, this enables the driver lines to be compactly arranged. Also, the connections between the driver lines and the electrodes can be conveniently made employing a three layer structure comprising: the driver lines; an insulating layer; and the electrodes, with the electrodes being connected to the driver lines at the required locations by viaing.

The above embodiments of the invention have been described merely by way of example, and it will be appreciated that many modifications and developments may be made to the described embodiments of the invention.

For example, the invention is applicable to displays which use a bistable or multi-stable liquid crystal material other than a ferroelectric liquid crystal material, and may find application in displays which use an astable liquid crystal material. The invention is also applicable to memory arrays which do not have a display function and to arrays of sensors such as light sensors.

In the embodiments of the invention described above, the state of the memory elements is affected by the application of a DC electric field. In the case of display or memory arrays which are AC driven, the resistors may be replaced by other passive voltage-drop elements or impedances, such as capacitors.

The embodiments described above employ a two-dimensional array, but the invention is also applicable to one-dimensional arrays (for example to print bars) and to arrays having three or more dimensions.

Figure 10:
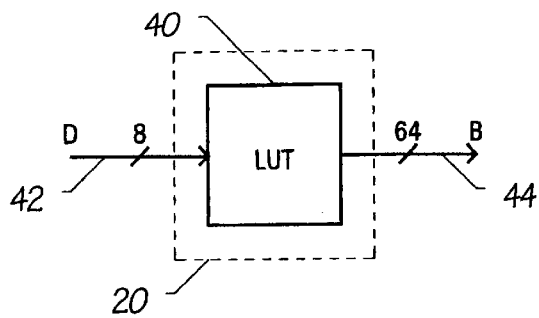
FIG. 10 is a block diagram of one embodiment of decoder which may be used in the electrode arrangements mentioned above.

In the embodiments described above, the drivers 20, 20L, 20R, 22 act as decoders, and the drivers 20, 20L, 20R, 22 in combination with the network configuration of resistors 26 form a decoding system. The decoders provide a 1-to-1 mapping from the input or address value to the combination of driver lines which are stimulated in response to that address value. In order to do this, as shown in FIG. 10, and as described in U.S. Pat. No. 5,034,736, a look-up table 40 may be used. In the embodiment shown in FIG. 10, the look-up table 42 receives an 8-bit address on a bus 42 of one of 256 row or column electrodes to be activated, and in response activates a respective combination of four of the sixty-four driver lines 44. Although not shown in FIG. 10, each electrode 16 (or 18) is connected by four resistors 26 to a respective combination of four of the driver lines 44, and the arrangement has the parameters c=4 and v=1.

It is difficult in practice to find activation patterns (like the one presented in Table 1) with the necessary properties of large N for small n and large c/v. The solution space for finding useful sets of large binary patterns is vast, and special techniques must be used to generate results in reasonable computation times. However, once a set of activation patterns has been found, it can be employed in a decoder using either a look-up table or only simple computations (as described below).

Decoding systems will be described below with reference to their application in display addressing, and consequently terminology directly applicable to display addressing will be used. However, the invention has more general application. More generally, "intermediate nodes" can be understood by references to "driver lines", and "outputs" can be understood by references to "display electrodes".

Two basic approaches have been investigated for finding sets of activation patterns with the required properties. The first is combinatorial search. The second is based on a connection which has been discovered between the properties of the activation patterns and constant weight codes.

Combinatorial searching has the useful property of not being limited to solutions of particular types; solutions with any values of c and v can be searched for, and results reasonably close to the best possible can be achieved. As a simple example for the case of an activation pattern having the parameters n=22, c=4 and v=1, brute-force searching has been used to obtain a set of N=31 activation patterns, in which N is larger than n. Theoretically, it can be shown that the maximum possible value of N is 37 in this case: see A. E. Brouwer, J. B. Shearer, N. J. A. Sloane and W. D, Smith, "A New Table of Constant Weight Codes", *IEEE Transactions on Information Theory,* IT-36 (1990), 1334–1380.

So it has been shown that searching can produce results reasonably close to the best possible. In practice, the values of n and N would be larger than this (for example, N may be many thousands) and, because of the growth of N with respect to n, the achieved levels of interconnect reduction are then-much better than in this example. However, searching becomes more difficult as the numbers of active bits and overlap bits grow, because the search space grows also and in fact soon becomes extremely large for fairly modest values of n. This problem is particularly acute for the relatively large number n of driver lines likely to be needed for example in a high-resolution display application where N may be many thousands even though n is required to be very much less than N. Special optimisations are usually needed to make the search produce results in reasonable times. However, searching has been used effectively with present-day computing apparatus to find solutions for n up to a few hundred and N up to tens of thousands.

Fortunately, a lengthy search is only needed when designing the activation patterns, and the resulting solution can be stored and used for subsequent implementation, both to construct the decoder connections and subsequently to generate activation patterns. These may be stored for example in a look-up table 40 which can be located within the driver chips, or alternatively can reside in system memory, depending on the particular design. The table can also be made smaller using appropriate data-compression techniques. However, the need for a look-up table has extra cost implications in the final system, and a method that obviates the need for a large look-up table 40 would be preferable.

An additional disadvantage with combinatorial searching techniques is the difficulty of efficiently finding solutions with special properties, such as multi-line addressing. These properties will be described in more detail below.

A second method for generating activation patterns has been investigated which allows them to be constructed directly, rather than searched for, and is based on a connection which has been discovered between sets of activation patterns possessing the required properties and what are known in the coding-theoretic literature as constant weight codes. A constant weight code with parameters (n, d, c) is a set of length n binary word s (called codewords), each word containing exactly c 1's, and each pair of words having a Hamming distance of at least d. The Hamming distance of a pair of binary words is simply the number of positions in which they differ, ie in which one word has a 1 and the other a 0.

Constant weight codes are of fundamental importance in coding theory and have attracted much attention because of that, see Brouwer et al, supra, and F. J. MacWilliams and N. J. A. Sloane, "The Theory of Error-correcting Codes (6th Edition)," North-Holland, Amsterdam, 1993.

The precise correspondence between these codes and sets of activation patterns with the required properties is as follows: there exists a constant weight code with parameters (n, d, c) having N codewords if and only if there exists a set of N length n activation patterns with c connections per row electrode and maximum crosstalk v equal to c−d/2. These codewords are used to specify connections from driver lines to electrodes. Accordingly, each codeword gives rise to an activation pattern for a row electrode in the following manner. If there is a 1 in the i-th position in a codeword, then a connection is made between the electrode and the i-th driver line, otherwise no connection is made. In this way, each row electrode is connected to c driver lines, and any pair of electrodes have at most v=c−d/2 commonly connected driver lines.

This correspondence allows the existing theory of constant weight codes to be applied to the construction and evaluation of sets of activation patterns and useful new results of additional benefit to be derived.

Figure 11:
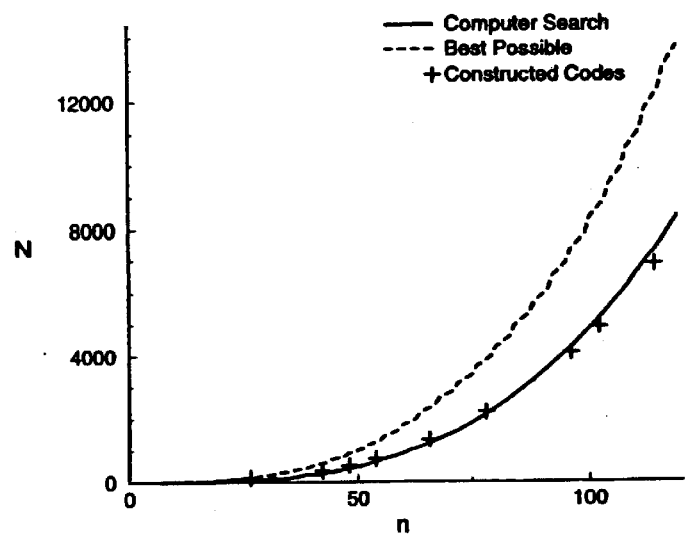
FIG. 11 is a graph to illustrate a comparison between a number N of display lines and a number n of driver lines.

The success of this approach depends on finding methods that are both flexible (in terms of the ranges of parameters for which sets of activation patterns can be constructed) and efficient (in terms of producing sets with an activation pattern length n that is small compared to the parameter N). FIG. 11 compares the solutions for N versus n found by constructive and combinatorial methods for the case of c=6 and v=2. Only a few suitable constructive solutions have been found for these parameters, and the resulting values of N/n are in this case similar to those of brute-force solutions. Also shown in FIG. 11 is a theoretical upper bound on the value of N as described in S. M. Johnson, "Upper Bounds for Constant Weight Error Correcting Codes", Discrete Mathematics, Vol. 3 (1972), 109–124.

It has been realised that using constructive methods to produce sets of activation patterns can yield sets having several features making them advantageous over solutions obtained by searching techniques. To obtain such features requires a novel and mathematically sophisticated analysis of the particular construction methods, a key step in such an analysis being to obtain both (a) a fixed correspondence between the activation patterns and the electrode number and (b) a method which, when presented with such a number, generates the corresponding activation pattern. The method and correspondence will be specific to the particular code construction.

A first advantage is that such a correspondence and method can obviate the need to use a full look-up table because the activation patterns can be generated on the fly as needed, rather than being stored in ROM. The method can be very fast, memory efficient and suitable for implementation in hardware.

A second advantage, again revealed by close analysis of the mathematical structure of the code, is that well-chosen correspondences can enable multi-line addressing where more than one electrode is driven at a time from a single activation pattern. More specifically, multi-line addressing can be implemented efficiently in hardware or by a programmed computer, with activation patterns being obtained on the fly. Moreover, the choice of correspondence sometimes makes possible a hierarchy of multi-line addressing modes, where the display space is sub-divided into progressively finer partitions which can be individually addressed by activation patterns that are also obtained on the fly.

Three constructive methods for obtaining constant weight codes (and the corresponding sets of activation patterns) will now be discussed in detail. For reasons of brevity, this material is presented in mathematician's language, and the reader may wish to seek the advice of a mathematician skilled in the art of coding theory and the arithmetic of finite fields, or to consult the relevant literature in interpreting the following discussion. The three constructions are obtained from finite geometries, from difference families and from concatenation of codes.

Two types of addressing scheme have been developed based on finite geometries: one type based on "affine geometries", and the other type based on "projective geometries". The following Table 3 gives the parameters of a number of geometric addressing schemes having parameters of practical interest, "AG" standing for affine geometry and "PG" standing for projective geometry:

TABLE 3

| c | v | c/v | n | N | Geometry |
|---|---|-----|---|---|----------|
| 3 | 1 | 3 | 12 | 16 | PG(3, 2) |
| 3 | 1 | 3 | 24 | 64 | PG(4, 2) |
| 3 | 1 | 3 | 27 | 81 | AG(3, 3) |

TABLE 3-continued

| c | v | c/v | n | N | Geometry |
|---|---|-----|---|---|----------|
| 3 | 1 | 3 | 48 | 256 | PG(5, 2) |
| 3 | 1 | 3 | 81 | 729 | AG(4, 3) |
| 3 | 1 | 3 | 96 | 1024 | PG(6, 2) |
| 3 | 1 | 3 | 192 | 4096 | PG(7, 2) |
| 3 | 1 | 3 | 243 | 6561 | AG(5, 3) |
| 3 | 1 | 3 | 384 | 16384 | PG(8, 2) |
| 3 | 1 | 3 | 768 | 65536 | PG(9, 2) |
| 4 | 1 | 4 | 36 | 81 | PG(3, 3) |
| 4 | 1 | 4 | 64 | 256 | AG(3, 4) |
| 4 | 1 | 4 | 108 | 729 | PG(4, 3) |
| 4 | 1 | 4 | 256 | 4096 | AG(4, 4) |
| 4 | 1 | 4 | 324 | 6561 | PG(5, 3) |
| 4 | 1 | 4 | 972 | 59049 | PG(6, 3) |
| 4 | 1 | 4 | 1024 | 65536 | AG(5, 4) |
| 5 | 1 | 5 | 80 | 256 | PG(3, 4) |
| 5 | 1 | 5 | 125 | 625 | AG(3, 5) |
| 5 | 1 | 5 | 320 | 4096 | PG(4, 4) |
| 5 | 1 | 5 | 625 | 15625 | AG(4, 5) |
| 5 | 1 | 5 | 1280 | 65536 | PG(5, 4) |
| 6 | 1 | 6 | 150 | 625 | PG(3, 5) |
| 6 | 1 | 6 | 750 | 15625 | PG(4, 5) |
| 7 | 1 | 7 | 343 | 2401 | AG(3, 7) |
| 8 | 1 | 8 | 392 | 2401 | PG(3, 7) |
| 8 | 1 | 8 | 512 | 4096 | AG(3, 8) |

The specific parameters which can be achieved for the affine schemes (labelled AG(d, q) in the above table) are: $n=q^d$, $c=q$, $v=1$ and $N=q^{2d-2}$; and for the projective schemes (labelled PG(d, q) in the above table) are: $n=q^d+q^{d-1}$, $c=q+1$, $v=1$ and $N=q^{2d-2}$; where d is any positive integer and q is a power of a prime. Both of these families are highly efficient, in terms of having a ratio of N to n that is roughly a fraction $1-(1/q)$ of that possible for an optimal addressing scheme with the same values of n, c and v. The ratio of N to n is roughly $q^{d-2}$, and so increases rapidly as d increases.

Both of these families of schemes have very special properties which are directly related to the geometrical nature. An explanation of this and its consequences in relation to the the affine case will now be described, and very similar remarks also apply to the projective case. Considering the real 3-dimensional space around us, it can be imagined as composed of an infinite number of points and containing straight lines, with two lines having the property that they either meet in exactly one point of space, or they do not meet. Therefore any two lines meet in at most one point. This is the geometry of Euclid. A line can, of course, be thought of as being composed of the points it contains. The three-dimensional space also contains higher-dimensional variants of lines, called planes. A plane can be thought of as being made up of a set of parallel lines, or of the points it contains. According to Euclid, a line is either completely contained in a plane, or meets it in one point, or is parallel to it. The points of lines and planes can be described by simple equations.

In order to obtain configurations and codes, first a correspondence or mapping must be chosen between the points of this space and driver lines, and second a correspondence between the lines of this space and display lines. Using the second correspondence, a display line can be taken, the equation of the corresponding line in space can be found, that equation can be used to calculate the set of points on that line, and then, using the first correspondence, the set of driver lines corresponding to that set of points can be found. The activation pattern for the display line can then be defined to be the pattern that is active in the appropriate set of driver lines. The impedance network configuration for this display line connects the appropriate set of driver lines to the electrode. Because two lines in the space meet in at most one point, two activation patterns can overlap in at most one place. Therefore, it is possible to obtain sets of activation patterns with the required cross-talk properties.

The geometries which are actually used are not that of real space, but mathematical abstractions of it called affine and projective geometries. These differ in two basic ways from real space: the spaces are finite, that is containing a finite number of points and lines; and higher dimensional spaces are used. Indeed, the parameter d mentioned above is the actual dimension used. However, these geometries have the same basic properties that points, lines, planes and so on intersect in the expected way. For mathematical convenience, it is appropriate to work with spaces in which the number of points on a line is either q (in the affine case) or q+1 (in the projective case), where q is a power of a prime number. Accordingly, the final activation patterns (which correspond to lines of the space) will have either q or q+1 active positions. These finite spaces have (in general) far more lines than points, and so have a high ratio of N to n.

Of great importance is the choice of correspondences (or maps) between points of the space and driver lines, and lines of the space and electrodes lines: by making a careful choice of these correspondences, it is possible to develop efficient methods of computing the activation pattern needed for a particular display line. These methods essentially map this problem into a problem of calculating the points on a line in the appropriate finite geometry. They are highly efficient and suitable for either hardware implementation or programmed computer implementation. The detail of a method based on affine geometries is described later in this specification.

Recalling that a line meets a plane in at most one point or is completely contained in it, if all the driver lines corresponding to the points of a plane are activated, then the set of display lines which corresponds to the set of lines of the finite space which make up the chosen plane will be activated. Moreover, any display line which it is not intended to activate will have at most one of its driver lines activated, so that the residual cross-talk is no larger than before. This is a consequence of the fact that any line not contained in a plane meets that plane in at most one point. Therefore, many display lines may be simultaneously activated without interfering with the other display lines to a significant extent. Rather than working with merely planes, it is possible to take advantage of the dimensionality of the space and work with more general (d-c) dimensional objects for each $0 \leq c < d$. This allows sets of display lines with a variety of different sizes to be addressed. The same bounds on crosstalk will still apply. By making an even more careful choice of the maps between the finite space and the driver and display lines, it can be arranged that certain planes (and higher dimensional structures) correspond to contiguous sections of the display of the appropriate size. Moreover, the sets of driver lines that require activation in order to address such a region have a relatively simple structure and can be calculated on the fly.

In summary, for each c with $0 \leq c < d$, an efficient method has been developed for addressing sets of $q^{2d-2c-2}$ consecutive display lines (that is, a fraction of $1/q^{2c}$ of all display lines). Thus, the display can be divided into $q^{2c}$ segments, and each segment can be efficiently addressed with minimal cross-talk for the other segments. The $q^{d-c-1}$ driver lines that need to be activated are easy to calculate. It is also possible to activate intermediate-sized areas using similar techniques, at the cost of increased cross-talk for the display lines that are not to be activated. Therefore, a very simple method of addressing segments of the screen in a hierarchical arrangement is provided, with d levels of resolution.

The detail of a method based on affine geometries will now be described. The reader is assumed to have familiarity with finite fields and their arithmetic and sufficient mathematical sophistication.

In the following, $F_q$ denotes the finite field with q elements, and $Z_q$ denotes the set of integers $\{0, 1, \ldots, q-1\}$. Let $\phi$ be any map of $Z_q$ onto $F_q$, and $\gamma$ any map from $F_q$ onto $Z_q$. First, two maps are specified, $\Phi$ and $\Gamma$. Let D be an integer with $0 \leq D < q^{2d-2}$ representing the number of a display line. Write:

$$D = D_{2d-3}q^{2d-3} + D_{2d-4}q^{2d-4} + \ldots + D_1 q + D_0,$$

where $0 \leq D_i < q$ so that $(D_0, D_1, \ldots, D_{2d-3})$ is the base-q representation of D. Now define:

$$\Phi(D) = (x, y)$$

where $$x = (0, \phi(D_{2d-3}), \phi(D_{2d-5}), \ldots, \phi(D_1))$$

and $$y = (1, \phi(D_{2d-4}), \phi(D_{2d-6}), \ldots, (D_0)).$$

Here, 0 and 1 denote the appropriate elements of $F_q$.

The second map $\Gamma$ maps vectors of length d over $F_q$ to integers A with $0 \leq A < q^d$, representing driver lines. Let $x = (x_0, x_1, \ldots, x_{d-1})$ where $x_i \in F_q$. Define:

$$\Gamma(x) = \gamma(x_0)q^{d-1} + \gamma(x_1)q^{d-2} + \ldots + \gamma(x_{d-1}).$$

The connection of driver lines and display lines is now specified: for each integer D with $0 \leq D < q^{2d-2}$:

compute $(x, y) = \Phi(D)$;

using $F_q$-arithmetic, compute, for each $\mu \in F_q$, the vector $z_{82} = \mu x + (1-\mu)y$ (this step is more efficiently carried out by first computing the vector $z = (x-y)$, and then the vectors $(\mu z + y)$; and connect the q driver lines numbered $\Gamma(z_\mu), \mu \in F_q$ to display line number D.

These computations need to be done just once, when the addressing system is manufactured. When the system is in use, to calculate the driver lines to activate for a particular display line D, the following steps are carried out:

compute $(x, y) = \Phi(D)$;

using $F_q$-arithmetic, compute, for each $\mu \in F_q$, the vector $z_\mu = \mu x + (1-\mu)y$; and activate the q driver lines numbered $\Gamma(z_\mu), \mu \in F_q$.

The computations required to perform any of the above operations are particularly simple when $q = 2^t$ or when q is prime. In the above description, the pair (x, y) defines a line of the affine geometry AG(d, q) of dimension d over $F_q$; this is the unique line of the geometry passing through both the points x and y. The vectors $z_\mu$, where $\mu \in F_q$, represent the points on that line.

As a specific example, let $q = 4 = 2^2$ and $d = 3$. The elements of $F_4$ are represented by the binary vectors of length two: 00, 01, 10, 11. With this representation, addition of field elements is achieved by component-wise XOR of vectors, while multiplication is as specified in the following Table 4:

TABLE 4

|    | 00 | 10 | 01 | 11 |
|----|----|----|----|----|
| 00 | 00 | 00 | 00 | 00 |
| 10 | 00 | 10 | 01 | 11 |
| 01 | 00 | 01 | 11 | 10 |
| 11 | 00 | 11 | 10 | 01 |

There are therefore $q^d=64$ driver lines and $q^{2d-2}=256$ display lines. Let $\phi$ be the map $\phi(0)=00$, $\phi(1)=10$, $\phi(2)=01$, $\phi(3)=11$ and let $\gamma=\phi^{-1}$. Hence $\phi(a_0+2a_1)=a_0a_1\epsilon F_4$ and $\gamma((a_0a_1))=a_0+2a_1$. In order to compute the driver lines which should be activated for display line 114, say, we have, in base-4:

$$114 = 1\times 4^3 + 3\times 4^2 + 0\times 4^1 + 2\times 4^0$$

and so $\Phi(114)=(x, y)$ where:

$$x=(0, \phi(1), \phi(0))=(00, 10, 00);$$

and $$y=(1, \phi(3), \phi(2))=(10, 11, 01).$$

Then:

$$z_{00} = 00x + 10y = (10, 11, 01);$$

$$z_{10} = 10x + 00y = (00, 10, 00);$$

$$z_{01} = 01x + 11y = (11, 00, 10);$$

and $$z_{11} = 11x + 01y = (01, 01, 11);$$

and so computing the address $\Gamma(z_\mu)$ gives:

$$\Gamma(z_{00}) = 1\times 16 + 3\times 4 + 2 = 30;$$

$$\Gamma(z_{10}) = 0\times 16 + 1\times 4 + 0 = 4;$$

$$\Gamma(z_{01}) = 3\times 16 + 0\times 4 + 1 = 49;$$

and $$\Gamma(z_{11}) = 2\times 16 + 2\times 4 + 3 = 43.$$

Accordingly, it is necessary to connect driver lines 4, 30, 43 and 49 to display line 114, and when presented with the task of activating display line 114, to perform the above calculations. These computations are clearly suited for implementation in hardware.

Efficient procedures are provided for activating portions of the display. Suppose $0\leq c<d$ and it is desired to activate the set of $q^{2d-(2c+2)}$ consecutive display lines numbered:

$$D_{2d-3}q^{2d-3} + D_{2d-4}q^{2d-4} + \ldots + D_{2d-(2c+1)}q^{2d-(2c+1)} + D_{2d-(2c+2)}q^{2d-(2c+2)} + j$$

where $D_{2d-3}, \ldots, D_{2d-(2c+2)}$ are fixed and $0\leq j<q^{2d-(2c+2)}$ is arbitrary. This is a fraction $1/q^{2c}$ of all the display lines. Then, it is necessary to activate the set of driver lines numbered:

$$q^{d-1}\gamma(v) + q^{d-2}\gamma(\alpha_1-v(\alpha_1-\beta_1)) + \ldots + q^{d-c-1}\gamma(\alpha_c-v(\alpha_c-\beta_c)) + j$$

where $v\epsilon F_q$ and $0\leq j<q^{d-c-1}$ are arbitrary and $\alpha_i=\phi(D_{2d-(2i+1)})$, $\beta_i=\phi(D_{2d-(2i+2)})$ for $1\leq i\leq c$.

The numbers of the driver lines corresponding to these points are again quite straightforward to calculate. They are exactly the numbers having a base-q representation which is arbitrary in the $d-c-1$ least significant digits and which are restricted to q out of $q^{c+1}$ values in the $c+1$ most significant digits. The complexity (in terms of number of field operations) of computing these digits increases linearly with cq. When this set of driver lines is activated, at most one driver line for any other display line will be activated.

As mentioned above, understanding the above discussion requires a degree of mathematical sophistication. An example of the finite geometries method will now be described in simpler mathematical terms avoiding the use of finite fields.

In the example of this method, the parameters are N=256, n=64, c=4 and v=1, and the fundamental units of computation for the code parameters are the integers 0, 1, 2 and 3. Two 4x4 tables are used which define two commutative binary operations $\oplus$, $\odot$ on the integers as shown in Tables 5 and 6, respectively:

TABLE 5

| $\oplus$ | 0 | 1 | 2 | 3 |
|---|---|---|---|---|
| 0 | 0 | 1 | 2 | 3 |
| 1 | 1 | 0 | 3 | 2 |
| 2 | 2 | 3 | 0 | 1 |
| 3 | 3 | 2 | 1 | 0 |

TABLE 6

| $\odot$ | 0 | 1 | 2 | 3 |
|---|---|---|---|---|
| 0 | 0 | 0 | 0 | 0 |
| 1 | 0 | 1 | 2 | 3 |
| 2 | 0 | 2 | 3 | 1 |
| 3 | 0 | 3 | 1 | 2 |

Given that the address of an display line is D, where $0\leq D<256$, the address can be represented as a length-4 vector $(D_3, D_2, D_1, D_0)$, where $0\leq_i D<4$, such that $D=(64D_3)+(16D_2)+(4D_1)+D_0$. The following steps are then performed:

1. a length-3 vector $\underline{x}$ is determined such that $\underline{x}=(0, D_3, D_1)$;
2. a length-3 vector $\underline{y}$ is determined such that $\underline{y}=(1, D_2, D_0)$;
3. a length-3 vector $\underline{z}=(Z_2, Z_1, Z_0)$ is then calculated such that $\underline{z}=\underline{x}\oplus\underline{y}$. In other words, $\underline{z}=(1, D_3\oplus D_2, D_1\oplus D_0)$;
4. Then, for each of the values of an integer A=0, 1, 2, 3, a respective length-3 vector $\underline{z}_A=(z_{2,A}, z_{1,A}, z_{0,A})$ is calculated such that $\underline{z}_A=\underline{y}\oplus(A\odot\underline{z})$. In other words: $z_{0,A}=y_0\oplus(A\odot z_0)$, $z_{1,A}=y_1\oplus(A\odot z_1)$ and $z_{2,A}=y_2\oplus(A\odot z_2)$; and
5. For each of the integers A=0, 1, 2, 3, a respective integer $B_A$ is then calculated such that $B_A=(16z_{2,A})+(4z_{1,A})+(z_{0,A})$ and such that $0\leq B_A<64$.

The set of four integers $B_0$, $B_1$, $B_2$ and $B_3$ are the numbers of those four of the 64 driver lines which are to be stimulated in the activation pattern for the particular display line D. Furthermore, the set of four integers $B_0$, $B_1$, $B_2$ and $B_3$ are the numbers of those four of the 64 driver lines to which the display line numbered D should be connected by its respective four resistors 26.

As an example, for the display line numbered D=114, the values calculated using the above method are:

$D=114$ or $(D_3, D_2, D_1, D_0)=(1, 3, 0, 2)$ $\underline{x}=(0, 1, 0)$ $\underline{y}=(1, 3, 2)$ $\underline{z}=(1, 1\oplus 3, 0\oplus 2)=(1, 2, 2)$ $\underline{z}_0=(1\oplus(0\odot 1), 3\oplus(0\odot 2), 2\oplus(0\odot 2))=(1, 3, 2)$ $\underline{z}_1=(1\oplus(1\odot 1), 3\oplus(1\odot 2), 2\oplus(1\odot 2))=(0, 1, 0)$ $\underline{z}_2=(1\oplus(2\odot 1), 3\oplus(2\odot 2), 2\oplus(2\odot 2))=(3, 0, 1)$ $\underline{z}_3=(1\oplus(3\odot 1), 3\oplus(3\odot 2), 2\oplus(3\odot 2))=(2, 2, 3)$ $B_0=(1\times 16)+(3\times 4)+2=30$ $B_1=(0\times 16)+(1\times 4)+0=4$ $B_2=(3\times 16)+(0\times 4)+1=49$ $B_3=(2\times 16)+(2\times 4)+3=43$ In other words, the display line numbered 114 should be connected by its resistors 26 to the driver lines numbered 4, 30, 43 and 49, and to address the display line numbered 114, the driver lines numbered 4, 30, 43 and 49 should be stimulated.

The detail of a method based on projective geometries will now be described. The connection between this method and the underlying geometry is similar in spirit to that described above in the case of affine geometries and will be understandable by a practitioner skilled in the appropriate mathematical disciplines.

In the following, let $\phi$ be any map of $Z_q$ onto $F_q$, and $\gamma$ any map from $F_q$ onto $Z_q$. First, two further maps are specified, $\Phi$ and $\Gamma$. Let D be an integer with $0\leq D<q^{2d-2}$ representing the number of a display line. Write:

$D=D_{2d-3}q^{2d-3}+D_{2d-4}q^{2d-4}+ \ldots +D_1 q+D_0,$ where $0\leq D_i<q$ and define:

$\Phi(D)=(x, y)$ where:

$x=(1, 0, \phi(D_{2d-3}), \phi(D_{2d-5}), \ldots, \phi(D_1))$ and $y=(1, 1, \phi(D_{2d-4}), \phi(D_{2d-6}), \ldots, \phi(D_0)).$ Thus, x and y are length d+1 vectors over $F_q$.

The second map $\Gamma$ is defined on a subset of the length d+1 vectors over $F_q$ and produces integers A with $0\leq A<(q^d+q^{d-1})$. It is defined as follows:

$\Gamma(1, x_1, \ldots, x_d)=\gamma(x_1)q^{d-1}+\gamma(x_2)q^{d-2}+ \ldots +\gamma(x_d)$ and $\Gamma(0, 1, x_2, \ldots, x_d)=q^d+0\cdot q^{d-1}+\gamma(x_2)q^{d-2}+ \ldots +\gamma(x_d)$ The connection of driver lines and display lines is now specified:

compute $(x, y)=\Phi(D)$;

using $F_q$-arithmetic, compute the vector $z_\infty=-x+y$ and, for each $\mu\in F_q$, the vector $z_\mu=\mu x+(1-\mu)y$; and connect the q+1 driver lines numbered $\Gamma(z_\infty)$ and $\Gamma(z_\mu)$, $\mu\in F_q$, to display line number D.

These computations need to be carried out just once, when the addressing system is manufactured. When the system is in use, to calculate the driver lines to activate for a particular display line D, the following steps are carried out:

compute $(x, y)=\Phi(D)$;

using $F_q$-arithmetic, compute the vector $z_\infty=-x+y$ and, for each $\mu\in F_q$, the vector $z_\mu=\mu x+(1-\mu)y$; and activate the q+1 driver lines numbered $\Gamma(z_\infty)$ and $\Gamma(z_\mu)$, $\mu\in F_q$.

An efficient procedure for obtaining multi-line addressing in this projective addressing scheme will now be described.

Suppose $0\leq c<d$ and it is desired to activate the set of $q^{2d-(2c+2)}$ consecutive display lines numbered:

$D_{2d-3}q^{2d-3}+D_{2d-4}q^{2d-4}+ \ldots +D_{2d-(2c+1)}q^{2d-(2c+1)}+D_{2d-(2c+2)}q^{2d-(2c+2)}+j.$ where $D_{2d-3}, \ldots, D_{2d-(2c+2)}$ are fixed and $0\leq j<q^{2d-(2c+2)}$ is arbitrary. This is a fraction $1/q^{2c}$ of all the display lines in this projective scheme. Write $\alpha_i=\phi(D_{2d-(2i+1)})$ and $\beta_i=\phi(D_{2d-(2i+2)})$ for $1\leq i\leq c$. Then, it is necessary to activate the set of driver lines numbered:

$q^{d-1}\gamma(\sigma)+q^{d-2}\gamma(\alpha_1-\sigma(\alpha_1-\beta_1))+ \ldots +q^{d-c-1}\gamma(\alpha_c-\sigma(\alpha_c-\beta_c))+j$ where $\sigma\in F_q$ and $0\leq j<q^{d-c-1}$ are arbitrary, as well as the driver lines numbered:

$q^d+q^{d-2}\gamma(\beta_1-\alpha_1)+ \ldots +q^{d-c-1}\gamma(\beta_c-\alpha_c)+j$ where $0\leq j<q^{d-c-1}$ is arbitrary.

These $q^{d-c-1}(q+1)$ addresses are easily computed from the values of the $\alpha_i$ and $\beta_i$ using arithmetic in $F_q$. The complexity (in terms of number of field operations) of computing the set of addresses increases linearly with cq. Thus the display can be divided into $q^{2c}$ segments, and each segment can be efficiently addressed. The cross-talk for the other segments of the display is at most one. It is also possible to activate intermediate-sized areas using similar techniques, at the cost of increased cross-talk for the display lines that are not to be activated. Therefore, a very simple method for addressing segments of the display in an hierarchical arrangement is provided, with d levels of resolution.

The second family of addressing schemes based on difference families will now be described. For background information, reference is directed to T. Beth, D. Jungnickel and H. Lenz, "Design Theory", Cambridge University Press, 1993. These schemes all have v=1 and small values of c. Typically, c is 3, 4, 5 or 6, although larger values of c are possible. They allow a reasonably flexible choice of n. The number of display lines N is equal to n (n−1)/c(c−1) for these schemes. This is in fact the largest possible number of display lines for any scheme, given the parameters n, c and v=1.

Addressing methods have been developed for these schemes. They are quite efficient, typically requiring that N bits of information are stored and that some simple computations are performed (at worst, some computations in a finite field). Examples of specific parameters for which the difference family schemes can be constructed are as follows:

for c=3, n is chosen such that n=1 or 3 mod 6, that is n is chosen from 1, 3, 7, 9, 13, 15, 19, 21, ...

for c=4, n is chosen from 25, 37, 61, 73, 97, 109, 181, 229, 241, 277, 337, 409, 421, 457, ...

for c=5, n is chosen from 41, 61, 81, 241, 281, ...

for c=6, n is chosen from 31, 91, 121, 151, 181, 211, 241, 271, 331, 421, 541, 571, 631, 691, ...

In T. Beth et al, supra, there are a number of constructions for difference families over groups. All of these constructions can be used to produce addressing schemes with optimal values of N for many different values of n, c and v=1.

The details of an addressing method for a particular set of difference families are now given. The modifications required to adapt this method to the other difference family schemes referred to above can be readily deduced from the following description.

Suppose q=1 mod 12 is a power of a prime and suppose $(-3)^{(q-1)/4} \neq 1$ in $F_q$. Then the method produces a scheme with parameters N=q(q−1)/12, n=q, c=4 and v=1. Let $\alpha$ be a primitive element in $F_q$, that is an element of multiplicative order q−1, and $\epsilon = \alpha^{(q-1)/3}$. Define $B_i = \{0, \alpha^{2i}, \epsilon\alpha^{2i}, \epsilon^2\alpha^{2i}\}$, where $0 \leq i < (q-1)/12$. In the following, let $\phi$ be any map from $Z_q$ onto $F_q$ and $\gamma$ any map from $F_q$ onto $Z_q$.

The connection of driver lines and display lines is now specified. For each D, $0 \leq D < q(q-1)/12$:

Compute integers $D_0$, $D_1$ with $0 \leq D_0 < q$ and $0 \leq D_1 < (q-1)/12$ such that $D = D_1 q + D_0$.

Using $F_q$-arithmetic, compute the set $\gamma(B_{D_1} + \phi(D_0))$, that is the 4-tuple:

$$\gamma(\phi(D_0)), \gamma(\alpha^{2D_1}+\phi(D_0)), \gamma(\epsilon\alpha^{2D_1}+\phi(D_0)), \gamma(\epsilon^2\alpha^{2D_1}+\phi(D_0))$$

where '+' denotes addition in the finite field $F_q$. This set $B_{D_1} + \phi(D_0)$ is called a translate of the set $B_{D_1}$, which is a base set of the difference family Connect the four driver lines with these numbers to display line number D.

These computations need to be carried out just once, when the addressing system is manufactured. When the system is in use, to calculate the driver lines to activate for a particular display line D, the following steps are carried out:

Compute integers $D_0$, $D_1$ with $0 \leq D_0 < q$ and $0_1 \leq D < (q-1)/12$ such that $D = D_1 q + D_0$.

Using $F_q$-arithmetic, compute the set $\gamma(B_{D_1} + \phi(D_0))$, that is the set of four numbers:

$$\gamma(\phi(D_0)), \gamma(\alpha^{2D_1}+\phi(D_0)), \gamma(\epsilon\alpha^{2D_1}+\phi(D_0)), \gamma(\epsilon^2\alpha^{2D_1}+\phi(D_0))$$

where '+' denotes addition in the finite field $F_q$.

Activate the four driver lines with these numbers.

These computational steps can be efficiently carried out either using $F_q$-arithmetic, or using $F_q$-arithmetic in combination with look-up tables containing the elements of the sets $B_i$, $0 \leq i < (q-1)/12$.

A third family of schemes is based on concatenation, which is a very powerful method of code construction. An introduction to concatenation is provided in F. J. MacWilliams and N. J. A. Sloane "The Theory of Error-Correcting Codes", Elsevier Science, North-Holland, 1977, 307–315. For further background information, reference is directed to N. Q. A, K. Györfi and J. L. Massey "Constructions of Binary Constant Weight-Cyclic Codes and Cyclically Permutable Codes", *IEEE Transactions on Information Theory* IT-38 (1992), 940–949; and O. Moreno, Z. Zhang, P. V. Kumar and V. A. Zinoviev, "New Constructions of Optimal Cyclically Permutable Constant Weight Codes", *IEEE Transactions on Information Theory,* IT-41 (1995), 448–455.

Concatenation can be used to produce a very flexible class of addressing schemes, some of which have performance comparable (in terms of the number N of display lines addressed for a given n, c, v) to that of the geometric schemes described above. It is also possible to find efficient on-the-fly addressing schemes and, in certain cases, multi-line addressing methods.

The parameters of concatenated schemes are quite complicated to describe in full generality, and again a sophisticated mathematical knowledge is required. Nevertheless, let $q_0, q_1, \ldots, q_{l-1}$ be prime powers (not necessarily distinct). Suppose $Q = \Pi_{i=0}^{l-1} q_i$ and $q = \min\{q_i\}$. Further, suppose c and k are integers satisfying $0 \leq k \leq c \leq q$. Then, using concatenation methods, it is possible to construct an overall network configuration with parameters n=Qc, c, v=k−1 and $N = Q^k$. The parameter N as a fraction of the upper bound on N is expressible as $$\binom{n}{v+1}\binom{c}{v+1}$$

and is largest when c is large and k is small. (The expression $$\binom{x}{y}$$

here denotes $x!/\{y!(x-y)!\}$.) In any case, configurations are typically attained with a value of N that is a reasonable fraction of the upper bound. By imposing restrictions on the parameter Q, and in turn on the $q_i$, it is possible to obtain families of configurations.

Further details of the concatenation construction are as follows. For $1 \leq i < l$, let $N_i = \Pi_{j=0}^{j=i-1} q_j$ and let $\alpha_{i,0}, \alpha_{i,1}, \ldots, \alpha_{i,q_i-1}$ be a list of the elements of $F_{q_i}$. Finally, let $\phi_i$ be any map from $Z_{q_i}$ onto $F_{q_i}$ and $\gamma_i$ be any map from $F_{q_i}$ onto $Z_{q_i}$. Suppose it is desired to calculate the activation pattern corresponding to display line D, where $0 \leq D < Q^k$. D can be written in a mixed base representation: $D = D_{l-1} N_{l-1}^k + D_{l-2} N_{l-2}^k + D_1 N_1^k + D_0$, where $0 \leq D_j < q_j^k$. In turn, $D_j$ can be written as a length k word in base q as $$D_j = \sum_{i=0}^{k-1} d_{i,j} q_j^i,$$

where $0 \leq d_{i,j} < q_j$, and this word can be associated with the degree k−1 polynomial with coefficients from $$F_{qj}: f_j(X) = \sum_{i=0}^{k-1} \phi_j(d_{i,j}) X^i.$$

A length c Q-ary word y is constructed where $y = (y_0, \ldots, y_{c-1})$ by defining $y_j = \gamma_0(f_0(\alpha_{0,j})) + \gamma_1(f_1(\alpha_{1,j})) N_1 + \ldots + \gamma_{l-1}(f_{l-1}(\alpha_{l-1,j})) N_{l-1}$, where $0 \leq j < c$. The activation pattern for display line D then has 1's set in the c positions: $y_j + jQ$, where $0 \leq j < c$, and 0's in every other position.

The constant weight code underlying this construction is a concatenated code in which the inner code is the binary orthogonal code of length Q and in which the outer code is obtained from a direct product of Reed-Solomon codes over finite fields with $q_i$ elements where $0 \leq i \leq l-1$.

It can therefore be seen that the process of calculating the activation pattern for a particular display line D requires the conversion of D to a mixed base representation, then to a list of polynomials $f_0, \ldots, f_{l-1}$ which are evaluated at certain points (using finite field arithmetic). The results of these evaluations are then combined to determine the active positions in the pattern for line D. The calculations (despite the complexity of the above description) are quite straightforward. They are particularly simple when each $q_i$ is a prime rather than a prime-power, because it is then possible to use arithmetic modulo p. They are even simpler when the $p_i$ are all equal.

It should be noted that, in the above scheme, the values of the polynomials $f_0$ determine the least significant digits (in the mixed-base representation of numbers) of the positions of 1's in activation patterns. If $f_0$ is allowed to range over all possible polynomials (of degree at most k−1), then these least significant digits take on all possible values. The set of display lines corresponding to this variation in the polynomials $f_0$ is the set having some fixed digits $D_1, \ldots, D_{l-1}$ and having any value for $D_0$. This is simply a set of $q_0^k$ consecutive display lines. Hence, it is possible to activate any one of $Q^k/q_0^k$ blocks of consecutive display lines of size $q_0^k$ simply by activating an easily calculated set of $cq_0$ display lines. It is also true that any other display line has a network configuration with crosstalk still at most v when compared to this weight $cq_0$ activation pattern.

These ideas can be extended to allow activation of blocks of $(q_0 q_1 \ldots q_r)^k$ display lines using easily calculated activation patterns of weight $cq_0 q_1 \ldots q_r$, for each choice of r with $0 \leq r < l$. The cross talk for other display lines is still at most v. The calculations are no more complex than before.

Two examples of the concatenation construction are given below, and there are many other possibilities.

In the first example of a concatenated scheme, c=4 and v=2. Suppose that Q=1, 4, 5, 7, 8 or 11 mod 12. Then, $Q \neq 2$ mod 4 and $Q \neq 0$ mod 3. Hence, the smallest prime-power divisor of Q is 4 so we can write $Q=\Pi_{i=0}^{i=l-1} q_i$ where each $q_i$ is a prime power greater than or equal to 4. So $q=\min q_i \geq 4$. Hence, t=4 and k=3 can be taken to obtain a configuration with: n=4Q, c=4, v=2, and $N=Q^3$, for Q=1, 4, 5, 7, 8 or 11 mod 12. Writing n=4Q, we have $Q^3=n^3/64$, and it can be seen that the configuration has $N=n^3/64$ patterns. For these parameters, the upper bound of Johnson, supra, is roughly $n^3/24$. Therefore, this family is fairly efficient, attaining about 37½ per cent of the best possible value of N.

In the second example of a concatenated scheme, c=5 and v=1. Suppose that Q=1 or 5 mod 6. Then the smallest prime-power divisor of Q is 5. Hence, $q \geq 5$, and t=5 and k=2 can be taken to obtain a configuration with: n=5Q, c=5, v=1 and $N=Q^2$, for Q=1 or 5 mod 6. Writing n=5Q, we have $Q^2=n^2/25$, and it can be seen that the configuration has $N=n^2/25$ patterns. For these parameters, the upper bound of Johnson, supra, is roughly $n^2/20$. Therefore, this family is very efficient, attaining about 80 per cent of the best possible value of N.

Using the concatenation structure inherent in these configurations, it is possible to obtain an efficient method which calculates activation patterns for the network. This method is best suited for implementation by a programmed computer, although specific instances may be implemented in hardware.

Considering multi-line addressing in the context of concatenated schemes, it may be recalled that $Q=\Pi_{i=0}^{l-1} q_i$. If the assignment of activation patterns and network configurations to display lines is made with care, then it is possible to have l hierarchical levels of multi-line addressing. At the finest level, it is possible to address blocks of $q_0^k$ consecutive display lines by activating $cq_0$ driver lines. The overall activation pattern required is quite straightforward to calculate. The cross-talk with any other display line (outside the set of display lines in the block of $q_0^k$) is still at most v. In the next level, it is possible to address blocks of $(q_0 q_1)^k$ consecutive display lines by activating $c(q_0 q_1)$ driver lines, and so on.

Another family of addressing schemes which enjoy another kind of multi-line addressing capability is now described. These schemes all have c=2 and v=1. They have the property that, for some fixed integer $t \geq 2$, any one or two or three or indeed any number not more than t of consecutive display electrodes (outputs) may be activated by an easily computed activation pattern, whilst any other display line still has a network configuration with crosstalk at most 1 when compared to this activation pattern.

As previously, methods are described for connecting the intermediate nodes (driver lines) with the output nodes (display lines) along with algorithmic and plural stage processes for calculating which intermediate nodes should be stimulated in order to fully activate any particular output node.

A first addressing scheme is described in the case where t=2 and n, the number of driver lines, is at least 7. Another parameter w is now associated with n, and defined such that: w=int((n−3)/4). The number N of output nodes in our addressing scheme is equal to 2nw and for each n, is at least as large as the integer $n^2/2 - 3n$. This is within 5n/2 of the maximum possible number $$\binom{n}{2}$$

of display electrodes in a scheme with n driver lines with c=2 and v=1. There is the additional advantage that any consecutive pair of display electrodes may be simultaneously addressed.

The connections between driver lines and display electrodes are now described. Let D be the number of a display electrode, where $0 \leq D < 2nw$.

Write D=2ni+j where $0 \leq j < 2n$ and $0 \leq i < w$.

If j is even, then connect output numbered D to the driver lines numbered j/2 and (j/2)−2−2i mod n.

If j is odd, then connect output numbered D to the driver lines numbered ((j−1)/2)−2−2i mod n and (j+1)/2 mod n.

For n=10, we have w=2 and the above procedure results in 40 activation patterns, each containing two 1's. The list of activation patterns for this example is shown in Table 7 below.

TABLE 7

| | |
|---|---|
| 0: 1000000010 | 20: 1000001000 |
| 1: 0100000010 | 21: 0100001000 |
| 2: 0100000001 | 22: 0100000100 |
| 3: 0010000001 | 23: 0010000100 |
| 4: 1010000000 | 24: 0010000010 |
| 5: 1001000000 | 25: 0001000010 |
| 6: 0101000000 | 26: 0001000001 |
| 7: 0100100000 | 27: 0000100001 |
| 8: 0010100000 | 28: 1000100000 |
| 9: 0010010000 | 29: 1000010000 |
| 10: 0001010000 | 30: 0100010000 |
| 11: 0001001000 | 31: 0100001000 |
| 12: 0000101000 | 32: 0010001000 |
| 13: 0000100100 | 33: 0010000100 |
| 14: 0000010100 | 34: 0001000100 |
| 15: 0000010010 | 35: 0001000010 |
| 16: 0000001010 | 36: 0000100010 |
| 17: 0000001001 | 37: 0000100001 |
| 18: 0000000101 | 38: 0000010001 |
| 19: 1000000100 | 39: 1000010000 |

This set of 40 activation patterns has the properties that any single activation pattern or any pair of consecutive activation patterns have crosstalk at most one with any further activation pattern.

Next the calculation process to be carried out by the address decoder is described. The input is the number of a display electrode to be activated, and the output is an activation pattern (equivalently, a pair of numbers in the range 0, 1, ... n−1 corresponding to driver lines). Let D be the number of a display electrode, where $0 \leq D < 2nw$. Integer D is input to the address decoder. Then:

Let j with $0 \leq j < 2n$ and i with $0 \leq i < w$ be the unique integers with $D=2ni+j$. In fact, $i=[D/2n]$ and $j=D$ mod $2n$.

If j is even, then output the activation pattern with 1's in positions $j/2$ and $(j/2)-2-2i$ mod n, and 0's elsewhere.

If j is odd, then output the activation pattern with 1's in positions $((j-1)/2)-2-2i$ mod n and $(j+1)/2$ mod n, and 0's elsewhere.

Finally for this scheme, it is described how an address decoder can calculate the activation pattern required to activate two consecutive display electrodes D and D+1, where $0 \leq D < 2nw-1$.

Let j with $0 \leq j < 2n$ and i with $0 \leq i < w$ be the unique integers with $D=2ni+j$. In fact, $i=[D/2n]$ and $j=D$ mod $2n$.

If j is even, then output the activation pattern with 1's in positions $j/2$, $(j/2)-2-2i$ mod n, and $j/2+1$ mod n and with 0's elsewhere.

If j is odd and $j \neq 2n-1$, then output the activation pattern with 1's in positions $((j-1)/2)-2-2i$ mod n, $(j+1)/2$ mod n, and $((j+1)/2)-2-2i$ mod n and with 0's elsewhere.

If j is odd and $j=2n-1$, then output the activation pattern with 1's in positions $((j-1)/2)-2-2i$ mod n, 0, and $-4-2i$ mod $2n$ and with 0's elsewhere.

An addressing scheme is now described in the cases where t=3 or t=4 and n, the number of driver lines, is at least 9. The parameter w is again used, but is now defined as $w=\text{int}((n-3)/6)$. The number N of output nodes in our addressing scheme is equal to $2nw$ and is roughly as large as the integer $n^2/3$.

The connections between driver lines and display electrodes are now described. Let D be the number of a display electrode, where $0 \leq D < 2nw$.

Write $D=2ni+j$ where $0 \leq j < 2n$ and $0 \leq i < w$.

If j is even, then connect output numbered D to the driver lines numbered $j/2$ and $(j/2)-3-3i$ mod n.

If j is odd, then connect output numbered D to the driver lines numbered $((j-1)/2)-3-3i$ mod n and $(j+1)/2$ mod n.

For n=12, we have w=1 and the above procedure results in 24 activation patterns, each containing two 1's. The list of activation patterns for this example set of parameters is shown in Table 8 below.

TABLE 8

| | |
|---|---|
| 0: 100000000100 | 12: 000100100000 |
| 1: 010000000100 | 13: 000100010000 |
| 2: 010000000010 | 14: 000010010000 |
| 3: 001000000010 | 15: 000010001000 |
| 4: 001000000001 | 16: 000001001000 |
| 5: 000100000001 | 17: 000001000100 |
| 6: 100100000000 | 18: 000000100100 |
| 7: 100010000000 | 19: 000000100010 |
| 8: 010010000000 | 20: 000000010010 |
| 9: 010001000000 | 21: 000000010001 |
| 10: 001001000000 | 22: 000000001001 |
| 11: 001000100000 | 23: 100000001000 |

This set of 24 activation patterns has the properties that any single activation pattern, or any pair of consecutive activation patterns, or any triple of consecutive activation patterns, or any quadruple of consecutive activation patterns, have crosstalk at most one with any further activation pattern.

Next the calculation process to be carried out by the address decoder is described. The input is the number of a display electrode to be activated, and the output is an activation pattern (equivalently, a pair of numbers in the range 0, 1, ... n−1 corresponding to driver lines). Let D be the number of a display electrode, where $0 \leq D < 2nw$. Integer D is input to the address decoder. Then:

Let j with $0 \leq j < 2n$ and i with $0 \leq i < w$ be the unique integers with $D=2ni+j$. In fact, $i=\text{int}(D/2n)$ and $j=D$ mod $2n$.

If j is even, then output the activation pattern with 1's in positions $j/2$ and $(j/2)-3-3i$ mod n, and 0's elsewhere.

If j is odd, then output the activation pattern with 1's in positions $((j-1)/2)-3-3i$ mod n and $(j+1)/2$ mod n, and 0's elsewhere.

Finally for this scheme, it is described how an address decoder can calculate the activation pattern required to activate any s consecutive display electrodes D, D+1, ... D+s−1 where $2 \leq s \leq 4$ and $0 \leq D < N-s+1$. A simple way to achieve this is to execute the above plural stage process s times, once for each integer that is the number of a display electrode to be activated.

Next are described families of addressing schemes for general values of t, where $t \geq 5$. For each value of t is described a family of addressing schemes, one scheme for each even value of n with $n \geq 6(t-1)$ containing $N=n^2/4-n(t-1)/2$ activation patterns.

The connections between driver lines and display electrodes are now described. Let D be the number of a display electrode, where $0 \leq D < n^2/4 - n(t-1)/2$. In the following, m denotes the integer $n/2$.

Write $D=(m-t+1)i+j$ where $0 \leq i < m$ and $0 \leq j < m-t+1$.

If $i=0$ mod 3, then connect output numbered D to the driver line numbered $m+i$ and to the driver line numbered by the j-th integer in the list:

$t-1, t, t+1, \ldots, 2t-3, 3t-3, 3t-2, \ldots, m-2, m-1, 2t-2,$
$2t-1, \ldots, 3t-5, 3t-4.$ If $i=1$ mod 3, then connect output numbered D to the driver lines numbered $m+i$ and to the driver line numbered by the j-th integer in the list:

$0, 1, 2, \ldots, t-2, 3t-3, 3t-2, \ldots, m-2, m-1, t-1, t, \ldots, 2t-3.$

If $i=2$ mod 3, then connect output numbered D to the driver lines numbered $m+i$ and to the driver line numbered by the j-th integer in the list:

$2t-2, 2t-1, 2t, \ldots, m-2, m-1, 0, 1, \ldots, t-2.$

As an example, for n=24 and t=5, m=n/2=12 and there is thus an addressing scheme with N=96 display electrodes. In this case, the three lists mentioned above are equal to $i=0$ mod 3: 4, 5, 6, 7, 8, 9, 10, 11

$i=1$ mod 3: 0, 1, 2, 3, 4, 5, 6, 7

$i=2$ mod 3: 8, 9, 10, 11, 0, 1, 2, 3

A sample of the activation patterns in this case is shown in Table 9 below.

TABLE 9

```
 0: 00001000000100000000000
 1: 00000100000100000000000
 2: 00000010000100000000000
 3: 00000001000100000000000
 4: 00000000100100000000000
 5: 00000000010100000000000
 6: 00000000001010000000000
 7: 00000000000110000000000
 8: 10000000000010000000000
 9: 01000000000010000000000
10: 00100000000010000000000
11: 00010000000010000000000
12: 00001000000010000000000
13: 00000100000010000000000
14: 00000010000010000000000
15: 00000001000010000000000
       . . .
       . . .
80: 10000000000000000000010
81: 01000000000000000000010
82: 00100000000000000000010
83: 00010000000000000000010
84: 00001000000000000000010
85: 00000100000000000000010
86: 00000010000000000000010
87: 00000001000000000000010
88: 00000000100000000000001
89: 00000000010000000000001
90: 00000000001000000000001
91: 00000000000100000000001
92: 10000000000000000000001
93: 01000000000000000000001
94: 00100000000000000000001
95: 00010000000000000000001
```

This set of 96 activation patterns has the properties that any single activation pattern, or any set of two, three, four or five consecutive activation patterns, have crosstalk at most one with any further activation pattern.

Next is described the calculation process to be carried out by the address decoder when a single display electrode is to be activated. The input is the number of a display electrode to be activated, and the output is an activation pattern (equivalently, a pair of numbers in the range 0, 1, . . . n−1 corresponding to driver lines).

Let D be the number of a display electrode, where $0 \leq D < n^2/4 - n(t-1)/2$. Integer D is input to the address decoder. Then:

Calculate the unique integers i and j with $0 \leq i < m$ and $0 \leq j < m-t+1$ which satisfy $D=(m-t+1)i+j$: take $j=D$ mod $(m-t+1)$ and $i=(D-j)/(m-t+1)$.

If i=0 mod 3, then output the activation pattern with 1's in position m+i and in the position indicated by the j-th integer in the list:

$t-1, t, t+1, \ldots, 2t-3, 3t-3, 3t-2, \ldots, m-2, m-1$ and with 0's in all other positions.

If i=1 mod 3, then output the activation pattern with 1's in position m+i and in the position indicated by the j-th integer in the list:

$0, 1, 2, \ldots, t-2, 3t-3, 3t-2, \ldots, m-2, m-1, t-1, t, \ldots, 2t-3$ and with 0's in all other positions.

If i=2 mod 3, then output the activation pattern with 1's in position m+i and in the position indicated by the j-th integer in the list:

$2t-2, 2t-1, 2t, \ldots, m-2, m-1, 0, 1, \ldots, t-2$ and with 0's in all other positions.

Finally for these schemes, it is described how an address decoder can calculate the activation pattern required to activate any s consecutive display electrodes D, D+1, . . . , D+s−1 where $2 \leq s \leq t$ and $0 \leq D < n^2/4 - n(t-1)/2 - s + 1$. A simple way to achieve this is to execute the above plural stage process s times, once for each integer that is the number of a display electrode to be activated.

Having described the theory underlying the pattern generation, network configuration and addressing techniques, specific embodiments of these techniques will now be described in detail.

In the design and manufacture of a display or the like, the network configuration of the impedances 26 or the like may be calculated by computer or by dedicated hardware. In the case of a computer, a general-computer may be used. An example of a program for producing the network configuration using the affine geometry AG (3, 4) technique with the parameters c=4, v=1, c/v=4, n=64 and N=256 is set out below. This program was written, for the purpose of illustration in this specification, in WordPerfect 6.1 macro language. In practice, of course, a more appropriate language would be used.

```
 1  Type (" Display line   Driver Lines")
 2  Type("  D            B₁ B₀ B₃ B₂)
 3
 4  ForNext (D3; 0; 3; 1)
 5    ForNext (D2; 0; 3; 1)
 6      ForNext (D1; 0; 3; 1)
 7        ForNext(D0; 0; 3; 1)
 8          D: = (64*D3) + (16*D2) + (4*D1) + D0
 9          Type (D)
10          ForEach (A; {1; 0; 3; 2})
11            Call (Calculate)
12            Type(B)
13          EndFor
14        EndFor
15      EndFor
16    EndFor
17  EndFor
18  Quit
19
20  Label (Calculate)
21    P: = D0;   Q: = D1;   Call (Plus);   Call (Dot); F0: = F
22    P: = D2;   Q: = D3;   Call (Plus);   Call (Dot); F1: = F
23    P: = D0;   Q: = F0;   Call (Plus);   B0: = Z
24    P: = D2;   Q: = F1;   Call (Plus);   B1: = Z
25    P: = 1;    Q: = A;    Call (Plus);   B2: = Z
26    B: = (16*B2) + (4*B1) + B0
27  Return
28
29  Label (Plus); Z: = (P + Q + (2*P*Q)) MOD 4; Return
30
31  Label (Dot)
32    If (A = 0 OR A = 1 OR Z = 0 OR Z = 1) F: = A*Z Else
33      If (Z = 2 AND A = 2) F: = 3 EndIf
34      If (Z = 2 AND A = 3) F: = 1 EndIf
35      If (Z = 3 AND A = 2) F: = 1 EndIf
36      If (Z = 3 AND A = 3) F: = 2 EndIf
37    EndIf
38  Return
```

The product of this program is set out in Table 10 below, and, as will be seen, display line numbered 0 should be connected to the driver lines numbered 0, 16, 32 and 48; the display line numbered 1 should be connected to the driver lines numbered 0, 17, 34, 51; and so on. Careful analysis of the results will confirm that no two display lines are to be connected in common to more than one driver line.

TABLE 10

| Display Line | Driver Lines | | | | Display Line | Driver Lines | | | |
|---|---|---|---|---|---|---|---|---|---|
| D | $B_1$ | $B_0$ | $B_3$ | $B_2$ | D | $B_1$ | $B_0$ | $B_3$ | $B_2$ |
| 0 | 0 | 16 | 32 | 48 | 1 | 0 | 17 | 34 | 51 |
| 2 | 0 | 18 | 35 | 49 | 3 | 0 | 19 | 33 | 50 |
| 4 | 1 | 16 | 35 | 50 | 5 | 1 | 17 | 33 | 49 |
| 6 | 1 | 18 | 32 | 51 | 7 | 1 | 19 | 34 | 48 |
| 8 | 2 | 16 | 33 | 51 | 9 | 2 | 17 | 35 | 48 |
| 10 | 2 | 18 | 34 | 50 | 11 | 2 | 19 | 32 | 49 |
| 12 | 3 | 16 | 34 | 49 | 13 | 3 | 17 | 32 | 50 |
| 14 | 3 | 18 | 33 | 48 | 15 | 3 | 19 | 35 | 51 |
| 16 | 0 | 20 | 40 | 60 | 17 | 0 | 21 | 42 | 63 |
| 18 | 0 | 22 | 43 | 61 | 19 | 0 | 23 | 41 | 62 |
| 20 | 1 | 20 | 43 | 62 | 21 | 1 | 21 | 41 | 61 |
| 22 | 1 | 22 | 40 | 63 | 23 | 1 | 23 | 42 | 60 |
| 24 | 2 | 20 | 41 | 63 | 25 | 2 | 21 | 43 | 60 |
| 26 | 2 | 22 | 42 | 62 | 27 | 2 | 23 | 40 | 61 |
| 28 | 3 | 20 | 42 | 61 | 29 | 3 | 21 | 40 | 62 |
| 30 | 3 | 22 | 41 | 60 | 31 | 3 | 23 | 43 | 63 |
| 32 | 0 | 24 | 44 | 52 | 33 | 0 | 25 | 46 | 55 |
| 34 | 0 | 26 | 47 | 53 | 35 | 0 | 27 | 45 | 54 |
| 36 | 1 | 24 | 47 | 54 | 37 | 1 | 25 | 45 | 53 |
| 38 | 1 | 26 | 44 | 55 | 39 | 1 | 27 | 46 | 52 |
| 40 | 2 | 24 | 45 | 55 | 41 | 2 | 25 | 47 | 52 |
| 42 | 2 | 26 | 46 | 54 | 43 | 2 | 27 | 44 | 53 |
| 44 | 3 | 24 | 46 | 53 | 45 | 3 | 25 | 44 | 54 |
| 46 | 3 | 26 | 45 | 52 | 47 | 3 | 27 | 47 | 55 |
| 48 | 0 | 28 | 36 | 56 | 49 | 0 | 29 | 38 | 59 |
| 50 | 0 | 30 | 39 | 57 | 51 | 0 | 31 | 37 | 58 |
| 52 | 1 | 28 | 39 | 58 | 53 | 1 | 29 | 37 | 57 |
| 54 | 1 | 30 | 36 | 59 | 55 | 1 | 31 | 38 | 56 |
| 56 | 2 | 28 | 37 | 59 | 57 | 2 | 29 | 39 | 56 |
| 58 | 2 | 30 | 38 | 58 | 59 | 2 | 31 | 36 | 57 |
| 60 | 3 | 28 | 38 | 57 | 61 | 3 | 29 | 36 | 58 |
| 62 | 3 | 30 | 37 | 56 | 63 | 3 | 31 | 39 | 59 |
| 64 | 4 | 16 | 44 | 56 | 65 | 4 | 17 | 46 | 59 |
| 66 | 4 | 18 | 47 | 57 | 67 | 4 | 19 | 45 | 58 |
| 68 | 5 | 16 | 47 | 58 | 69 | 5 | 17 | 45 | 57 |
| 70 | 5 | 18 | 44 | 59 | 71 | 5 | 19 | 46 | 56 |
| 72 | 6 | 16 | 45 | 59 | 73 | 6 | 17 | 47 | 56 |
| 74 | 6 | 18 | 46 | 58 | 75 | 6 | 19 | 44 | 57 |
| 76 | 7 | 16 | 46 | 57 | 77 | 7 | 17 | 44 | 58 |
| 78 | 7 | 18 | 45 | 56 | 79 | 7 | 19 | 47 | 59 |
| 80 | 4 | 20 | 36 | 52 | 81 | 4 | 21 | 38 | 55 |
| 82 | 4 | 22 | 39 | 53 | 83 | 4 | 23 | 37 | 54 |
| 84 | 5 | 20 | 39 | 54 | 85 | 5 | 21 | 37 | 53 |
| 86 | 5 | 22 | 36 | 55 | 87 | 5 | 23 | 38 | 52 |
| 88 | 6 | 20 | 37 | 55 | 89 | 6 | 21 | 39 | 52 |
| 90 | 6 | 22 | 38 | 54 | 91 | 6 | 23 | 36 | 53 |
| 92 | 7 | 20 | 38 | 53 | 93 | 7 | 21 | 36 | 54 |
| 94 | 7 | 22 | 37 | 52 | 95 | 7 | 23 | 39 | 55 |
| 96 | 4 | 24 | 32 | 60 | 97 | 4 | 25 | 34 | 63 |
| 98 | 4 | 26 | 35 | 61 | 99 | 4 | 27 | 33 | 62 |
| 100 | 5 | 24 | 35 | 62 | 101 | 5 | 25 | 33 | 61 |
| 102 | 5 | 26 | 32 | 63 | 103 | 5 | 27 | 34 | 60 |
| 104 | 6 | 24 | 33 | 63 | 105 | 6 | 25 | 35 | 60 |
| 106 | 6 | 26 | 34 | 62 | 107 | 6 | 27 | 32 | 61 |
| 108 | 7 | 24 | 34 | 61 | 109 | 7 | 25 | 32 | 62 |
| 110 | 7 | 26 | 33 | 60 | 111 | 7 | 27 | 35 | 63 |
| 112 | 4 | 28 | 40 | 48 | 113 | 4 | 29 | 42 | 51 |
| 114 | 4 | 30 | 43 | 49 | 115 | 4 | 31 | 41 | 50 |
| 116 | 5 | 28 | 43 | 50 | 117 | 5 | 29 | 41 | 49 |
| 118 | 5 | 30 | 40 | 51 | 119 | 5 | 31 | 42 | 48 |
| 120 | 6 | 28 | 41 | 51 | 121 | 6 | 29 | 43 | 48 |
| 122 | 6 | 30 | 42 | 50 | 123 | 6 | 31 | 40 | 49 |
| 124 | 7 | 28 | 42 | 49 | 125 | 7 | 29 | 40 | 50 |
| 126 | 7 | 30 | 41 | 48 | 127 | 7 | 31 | 43 | 51 |
| 128 | 8 | 16 | 36 | 60 | 129 | 8 | 17 | 38 | 63 |
| 130 | 8 | 18 | 39 | 61 | 131 | 8 | 19 | 37 | 62 |
| 132 | 9 | 16 | 39 | 62 | 133 | 9 | 17 | 37 | 61 |
| 134 | 9 | 18 | 36 | 63 | 135 | 9 | 19 | 38 | 60 |
| 136 | 10 | 16 | 37 | 63 | 137 | 10 | 17 | 39 | 60 |
| 138 | 10 | 18 | 38 | 62 | 139 | 10 | 19 | 36 | 61 |
| 140 | 11 | 16 | 38 | 61 | 141 | 11 | 17 | 36 | 62 |
| 142 | 11 | 18 | 37 | 60 | 143 | 11 | 19 | 39 | 63 |
| 144 | 8 | 20 | 44 | 48 | 145 | 8 | 21 | 46 | 51 |
| 146 | 8 | 22 | 47 | 49 | 147 | 8 | 23 | 45 | 50 |
| 148 | 9 | 20 | 47 | 50 | 149 | 9 | 21 | 45 | 49 |
| 150 | 9 | 22 | 44 | 51 | 151 | 9 | 23 | 46 | 48 |
| 152 | 10 | 20 | 45 | 51 | 153 | 10 | 21 | 47 | 48 |
| 154 | 10 | 22 | 46 | 50 | 155 | 10 | 23 | 44 | 49 |
| 156 | 11 | 20 | 46 | 49 | 157 | 11 | 21 | 44 | 50 |
| 158 | 11 | 22 | 45 | 48 | 159 | 11 | 23 | 47 | 51 |
| 160 | 8 | 24 | 40 | 56 | 161 | 8 | 25 | 42 | 59 |
| 162 | 8 | 26 | 43 | 57 | 163 | 8 | 27 | 41 | 58 |
| 164 | 9 | 24 | 43 | 58 | 165 | 9 | 25 | 41 | 57 |
| 166 | 9 | 26 | 40 | 59 | 167 | 9 | 27 | 42 | 56 |
| 168 | 10 | 24 | 41 | 59 | 169 | 10 | 25 | 43 | 56 |
| 170 | 10 | 26 | 42 | 58 | 171 | 10 | 27 | 40 | 57 |
| 172 | 11 | 24 | 42 | 57 | 173 | 11 | 25 | 40 | 58 |
| 174 | 11 | 26 | 41 | 56 | 175 | 11 | 27 | 43 | 59 |
| 176 | 8 | 28 | 32 | 52 | 177 | 8 | 29 | 34 | 55 |
| 178 | 8 | 30 | 35 | 53 | 179 | 8 | 31 | 33 | 54 |
| 180 | 9 | 28 | 35 | 54 | 181 | 9 | 29 | 33 | 53 |
| 182 | 9 | 30 | 32 | 55 | 183 | 9 | 31 | 34 | 52 |
| 184 | 10 | 28 | 33 | 55 | 185 | 10 | 29 | 35 | 52 |
| 186 | 10 | 30 | 34 | 54 | 187 | 10 | 31 | 32 | 53 |
| 188 | 11 | 28 | 34 | 53 | 189 | 11 | 29 | 32 | 54 |
| 190 | 11 | 30 | 33 | 52 | 191 | 11 | 31 | 35 | 55 |
| 192 | 12 | 16 | 40 | 52 | 193 | 12 | 17 | 42 | 55 |
| 194 | 12 | 18 | 43 | 53 | 195 | 12 | 19 | 41 | 54 |
| 196 | 13 | 16 | 43 | 54 | 197 | 13 | 17 | 41 | 53 |
| 198 | 13 | 18 | 40 | 55 | 199 | 13 | 19 | 42 | 52 |
| 200 | 14 | 16 | 41 | 55 | 201 | 14 | 17 | 43 | 52 |
| 202 | 14 | 18 | 42 | 54 | 203 | 14 | 19 | 40 | 53 |
| 204 | 15 | 16 | 42 | 53 | 205 | 15 | 17 | 40 | 54 |
| 206 | 15 | 18 | 41 | 52 | 207 | 15 | 19 | 43 | 55 |
| 208 | 12 | 20 | 32 | 56 | 209 | 12 | 21 | 34 | 59 |
| 210 | 12 | 22 | 35 | 57 | 211 | 12 | 23 | 33 | 58 |
| 212 | 13 | 20 | 35 | 58 | 213 | 13 | 21 | 33 | 57 |
| 214 | 13 | 22 | 32 | 59 | 215 | 13 | 23 | 34 | 56 |
| 216 | 14 | 20 | 33 | 59 | 217 | 14 | 21 | 35 | 56 |
| 218 | 14 | 22 | 34 | 58 | 219 | 14 | 23 | 32 | 57 |
| 220 | 15 | 20 | 34 | 57 | 221 | 15 | 21 | 32 | 58 |
| 222 | 15 | 22 | 33 | 56 | 223 | 15 | 23 | 35 | 59 |
| 224 | 12 | 24 | 36 | 48 | 225 | 12 | 25 | 38 | 51 |
| 226 | 12 | 26 | 39 | 49 | 227 | 12 | 27 | 37 | 50 |
| 228 | 13 | 24 | 39 | 50 | 229 | 13 | 25 | 37 | 49 |
| 230 | 13 | 26 | 36 | 51 | 231 | 13 | 27 | 38 | 48 |
| 232 | 14 | 24 | 37 | 51 | 233 | 14 | 25 | 39 | 48 |
| 234 | 14 | 26 | 38 | 50 | 235 | 14 | 27 | 36 | 49 |
| 236 | 15 | 24 | 38 | 49 | 237 | 15 | 25 | 36 | 50 |
| 238 | 15 | 26 | 37 | 48 | 239 | 15 | 27 | 39 | 51 |
| 240 | 12 | 28 | 44 | 60 | 241 | 12 | 29 | 46 | 63 |
| 242 | 12 | 30 | 47 | 61 | 243 | 12 | 31 | 45 | 62 |
| 244 | 13 | 28 | 47 | 62 | 245 | 13 | 29 | 45 | 61 |
| 246 | 13 | 30 | 44 | 63 | 247 | 13 | 31 | 46 | 60 |
| 248 | 14 | 28 | 45 | 63 | 249 | 14 | 29 | 47 | 60 |
| 250 | 14 | 30 | 46 | 62 | 251 | 14 | 31 | 44 | 61 |
| 252 | 15 | 28 | 46 | 61 | 253 | 15 | 29 | 44 | 62 |
| 254 | 15 | 30 | 45 | 60 | 255 | 15 | 31 | 47 | 63 |

Figure 12:
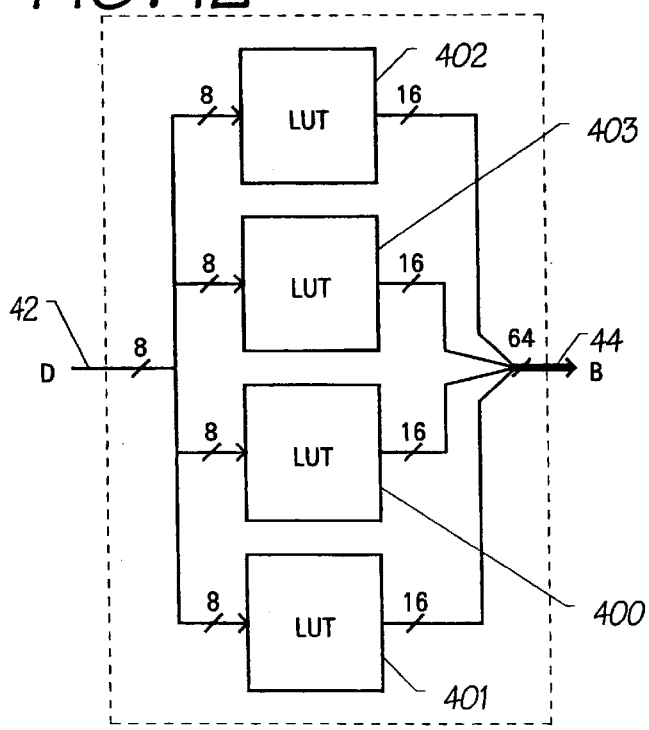
FIG. 12 is a block diagram illustrating a modification to the decoder of FIG. 10.

Having decided on a particular network configuration for the resistors 26, it is necessary to construct the decoder 20 to produce corresponding activation patterns. As described above with reference a FIG. 10, this may be done using a look-up table 40. Also, in the particular affine geometry scheme described above, it may be noted that the numbers $B_0$, $B_1$, $B_2$, and $B_3$ satisfy the relationships $0 \leq B_1 < 16$, $16 \leq B_0 < 32$, $32 \leq B_3 < 48$ and $48 \leq B_4 < 64$. Accordingly, as shown in FIG. 12, instead of using a look-up table 40 which maps an 8-bit address D on the bus 42 to four of 64 driver lines 44, four look-up tables 400, 401, 402 and 403 may be employed, each of which maps the 8-bit address 42 to one of sixteen of the 64 driver lines 44.

Figure 13:
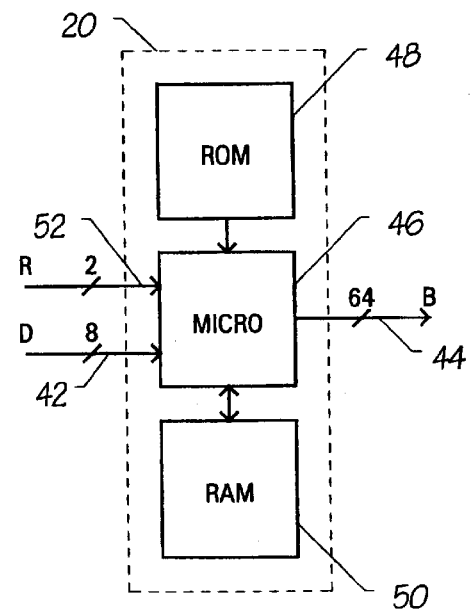
FIG. 13 is a block diagram of another embodiment of the decoder.

In an alternative embodiment as shown in FIG. 13, the decoder 20 is provided by a microprocessor 46 with associated ROM 48 which stores a program and associated RAM 50 which is used as working memory. The microprocessor 46 may be dedicated to the decoding task, or it may be provided by a microprocessor which performs other operations connected with the display. In operation, the microprocessor is programmed to map the 8-bit address value D on the bus 42 to activation of four of the 64 driver lines 44. An example of such a program, again written in WordPerfect 6.1 macro programming language, is given below.

```
 1  Repeat
 2    Call (Res1)
 3  Until (0)
 4
 5  Label (Res1)
 6    GetNumber (D3; "Enter bits 6 and 7 of address (0–3)";
         "Bits 6 and 7?")
 7    GetNumber (D2; "Enter bits 4 and 5 of address (0–3)";
         "Bits 4 and 5?")
 8    GetNumber (D1; "Enter bits 2 and 3 of address (0–3)";
         "Bits 2 and 3?")
 9    GetNumber (D0; "Enter bits 0 and 1 of address (0–3)";
         "Bits 0 and 1?")
10    ForEach (A; {1;0;3;2})
11      Call (Calculate)  Type(B)
12    EndFor
13  Return
14
15  Label (Calculate)
16      P: = D0;   Q: = D1;   Call (Plus);    Call (Dot); F0: = F
17      P: = D2;   Q: = D3;   Call (Plus);    Call (Dot); F1: = F
18      P: = D0;   Q: = F0;   Call (Plus);    B0: = Z
19      P: = D2;   Q: = F1;   Call (Plus);    B1: = Z
20      P: = 1;    Q: = A;    Call (Plus);    B2: = Z
21      B: = (16*B2) + (4*B1) + B0
22  Return
23
24  Label (Plus); Z: =(P + Q + (2*P*Q)) MOD 4; Return
25
26  Label (Dot)
27    If (A = 0 OR A = 1 OR Z = 0 OR Z = 1)
28      F: = A*Z
29    Else
30      If (Z = 2 AND A = 2) F: = 3 EndIf
31      If (Z = 2 AND A = 3) F: = 1 EndIf
32      If (Z = 3 AND A = 2) F: = 1 EndIf
33      If (Z = 3 AND A = 3) F: = 2 EndIf
34    EndIf
35  Return
```

(It should be noted that the above program is designed to take various inputs from a keyboard and display the outputs on a monitor. In practice, the instructions "GetNumber" in lines 6 to 9 and "Type" in line 11 would be replaced with instructions to get the various bits from the address bus 42 and activate the respective driver lines 44.)

Careful analysis of the 256 network configurations given above, and therefore of the identical activation patterns, will demonstrate that if the driver lines 44 are ORed together in ordered groups of four, then not only will the particular addressed display line be activated, but also the other fifteen driver display lines in the same group of sixteen display lines as the addressed display line, whereas the other display lines will receive no more than one quarter of full activation. In other words, if these OR operations are performed and the number of the addressed display line is D, then the display lines which are actually activated are those numbered (16× INT(D/16)) to 15+(16×INT(D/16)), where INT( ) denotes the integer part of ( ). Accordingly, multi-line addressing can be performed in blocks of sixteen lines. Furthermore, it may be noted that if all of the driver lines 44 are ORed together, then not only will the particular addressed display line be activated, but also all of the other 255 display lines.

Accordingly, multi-line addressing of the whole display can be performed. In order to provide this feature of selectable resolution of the display as between one line, sixteen lines and 256 lines, the program set out above may be modified as follows.

```
 1  Repeat
 2    GetNumber (Resolution; "Enter Resolution (1, 16 or 256)";
         "Resolution?")
 3    Case Call (Resolution; {1; Res1; 16; Res16; 256; Res256})
 4  Until (0)
 5
 6  Label (Res1)
 7    GetNumber (D3; "Enter bits 6 and 7 of address (0–3)";
         "Bits 6 and 7?")
 8    GetNumber (D2; "Enter bits 4 and 5 of address (0–3)";
         "Bits 4 and 5?")
 9    GetNumber (D1; "Enter bits 2 and 3 of address (0–3)";
         "Bits 2 and 3?")
10    GetNumber (D0; "Enter bits 0 and 1 of address (0–3)";
         "Bits 0 and 1?")
11    ForEach (A; {1;0;3;2})
12      Call (Calculate)  Type(B)
13    EndFor
14  Return
15
16  Label (Res 16)
17    GetNumber (D3; "Enter bits 6 and 7 of address (0–3)";
         "Bits 6 and 7?")
18    GetNumber (D2; "Enter bits 4 and 5 of address (0–3)";
         "Bits 4 and 5?")
19    D1:= 0   D0: = 0
20    ForEach (A; {1; 0; 3; 2})
21      Call (Calculate)   C: = 4*(B DIV 4)
22      For (B; C; C + 4-B; B + 1) Type (B) EndFor
23    EndFor
24  Return
25
26  Label (Res256)
27    ForNext (B; 0 ;255; 1) Type(B) EndFor
28  Return
29
30  Label (Calculate)
31      P: = D0;   Q: = D1;   Call (Plus);    Call (Dot); F0: = F
32      P: = D2;   Q: = D3;   Call (Plus);    Call (Dot); F1: = F
33      P: = D0;   Q: = F0;   Call (Plus);    B0: = Z
34      P: = D2;   Q: = F1;   Call (Plus);    B1: = Z
35      P: = 1;    Q: = A;    Call (Plus);    B2: = Z
36      B: = (16*B2) + (4*B1) + B0
37  Return
38
39  Label (Plus); Z: =(P + Q + (2*P*Q)) MOD 4; Return
40
41  Label (Dot)
42    If (A = 0 OR A = 1 OR Z = 0 OR Z = 1)
43      F: = A*Z
44    Else
45      If (Z = 2 AND A = 2) F: = 3 EndIf
46      If (Z = 2 AND A = 3) F: = 1 EndIf
47      If (Z = 3 AND A = 2) F: = 1 EndIf
48      If (Z = 3 AND A = 3) F: = 2 EndIf
49    EndIf
50  Return
```

(In addition to the above note about the instructions "Get-Number" and "Type", in line 2 of the above program the instruction "GetNumber" would be replaced with an instruction to get the resolution value from a 2-bit bus 52 as shown in FIG. 13, or at a different time from the bus 42.)

Figure 14:
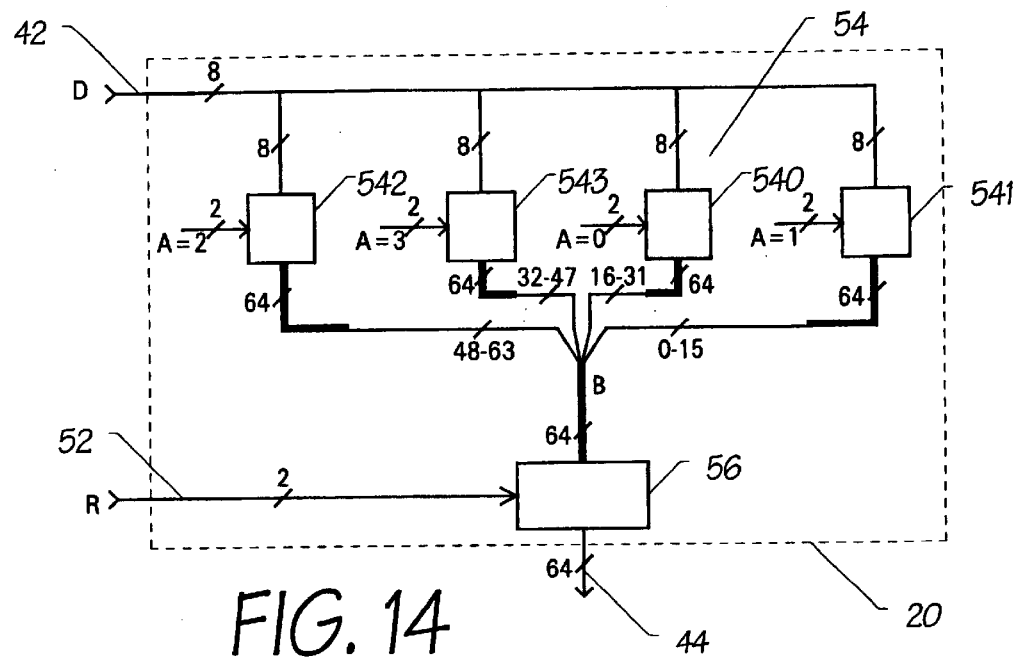
FIG. 14 is a block diagram of a further embodiment of the decoder.

A hard-wired hardware embodiment will now be described with reference to FIGS. 14 to 19. Referring firstly to FIG. 14, the decoder 20 comprises four calculation circuits 54 and a logic circuit 56. One of the calculation circuits 540 receives the 8-bit display line address D on bus 42 and the value A=0 to produce bits 16 to 31 of a 64-bit input B to the logic circuit 56. Another of the calculation circuits 541 receives the 8-bit display line address D on bus 42 and the value A=1 to produce bits 0 to 15 of the input B to the logic circuit 56. A further one of the calculation circuits 542 receives the 8-bit display line address D on bus 42 and the value A=2 to produce bits 48 to 63 of the input B to the logic circuit 56. The remaining calculation circuit 543 receives the 8-bit display line address D on bus 42 and the value A=3 to produce the remaining bits 32 to 47 of the input B to the logic circuit 56. The logic circuit 56 also receives a 2-bit resolution signal R on bus 52 and activates the driver lines 44.

Figure 15:
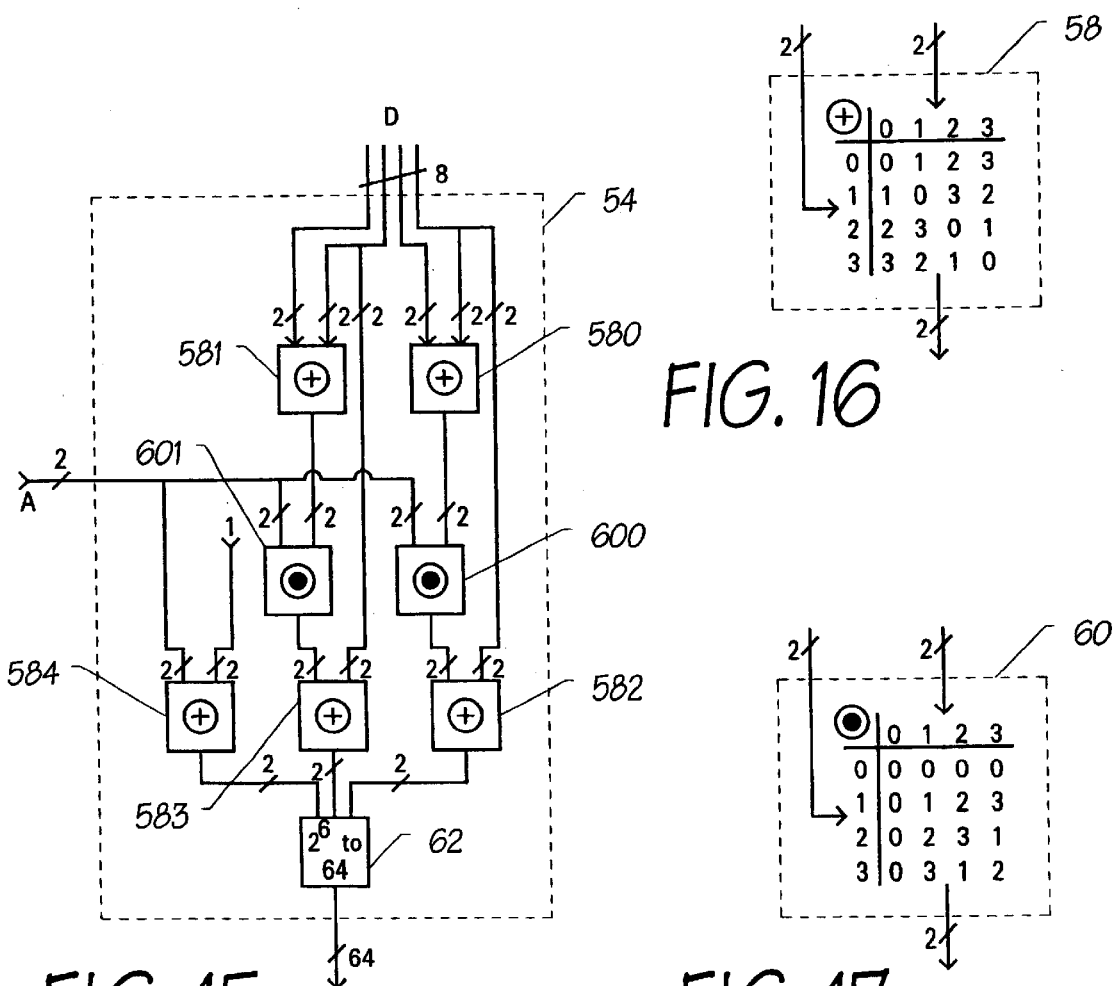
FIG. 15 shows in greater detail a circuit forming part of the decoder of FIG. 14.
Figure 16:
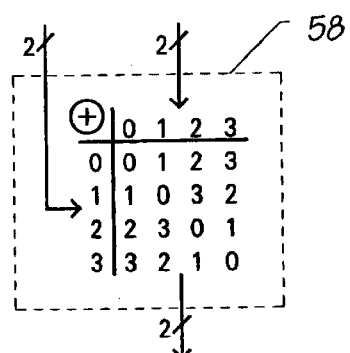
FIGS. 16 & 17 show in greater detail parts of the circuit of FIG. 15.
Figure 17:
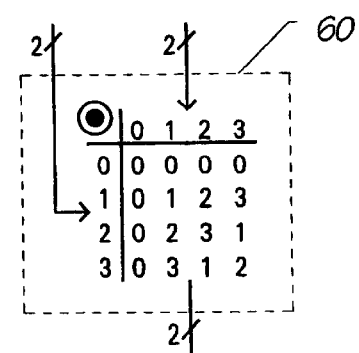

Referring to FIG. 15, each calculation circuit 54 comprises: five $\oplus$ look-up tables 58, as shown in FIG. 16, and providing the a binary operation described above; a pair of $\odot$ look-up tables 60, as shown in FIG. 17, and providing the $\odot$ binary operation described above; and a $2^6$ to 64 decoder 62.

The two $\oplus$ look-up tables 580, 581 provide a first stage of calculation; the $\odot$ look-up tables 600, 601 provide a second stage of calculation; the three $\oplus$ look-up tables 582, 583, 584 provide a third stage of calculation; and the decoder 62 provides a fourth stage of calculation. More specifically, the $\odot$ look-up table 580 receives the values $D_0$ and $D_1$ to generate the value $Z_0$. The $\odot$ look-up table 600 receives the value $Z_0$ and the value A and its output is provided to the $\oplus$ look-up table 582, together with the value $D_0$, so that the $\oplus$ look-up table 582 produces the value $z_{0,A}$. The $\oplus$ look-up table 581 receives the values $D_2$ and $D_3$ to generate the value $Z_1$. The $\odot$ look-up table 601 receives the value $Z_1$ and the value A, and its output is provided to the $\oplus$ look-up table 583, together with the value $D_2$, so that the $\oplus$ look-up table 583 produces the value $z_{1,A}$. The $\oplus$ look-up table 584 receives the value A and the value 1, and its output is therefore the value $z_{2,A}$. The values $z_{0,A}$, $z_{1,A}$ and $z_{2,A}$ are provided to the decoder 62 which generates the value $B_A$ described above.

These look-up tables can readily be replaced by appropriately constructed logic circuits. For example, a $\oplus$ look-up table can be replaced by a "bitwise or" circuit, and the skilled man will be aware of how to construct the appropriate logic circuit for any other mentioned look-up table.

As so far described, the four calculation circuits 54 are identical. In one modification, a single circuit 54 may be provided, in combination with a 64-bit output latch or register, with the circuit being run four times with a changing input A. In another modification, the four calculation circuits 54 differ slightly from each other, taking into account the different values of A. This reduces the overall amount of hardware required to implement the circuit.

Figure 18:
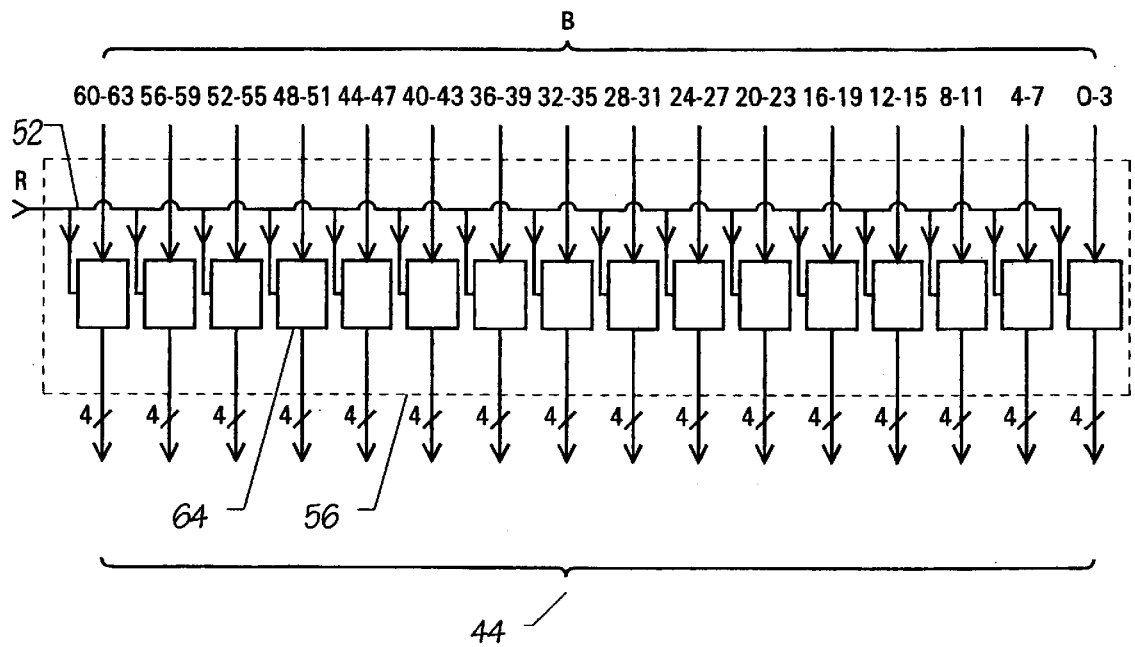
FIG. 18 shows in greater detail part of the circuit of FIG. 14.
Figure 19:
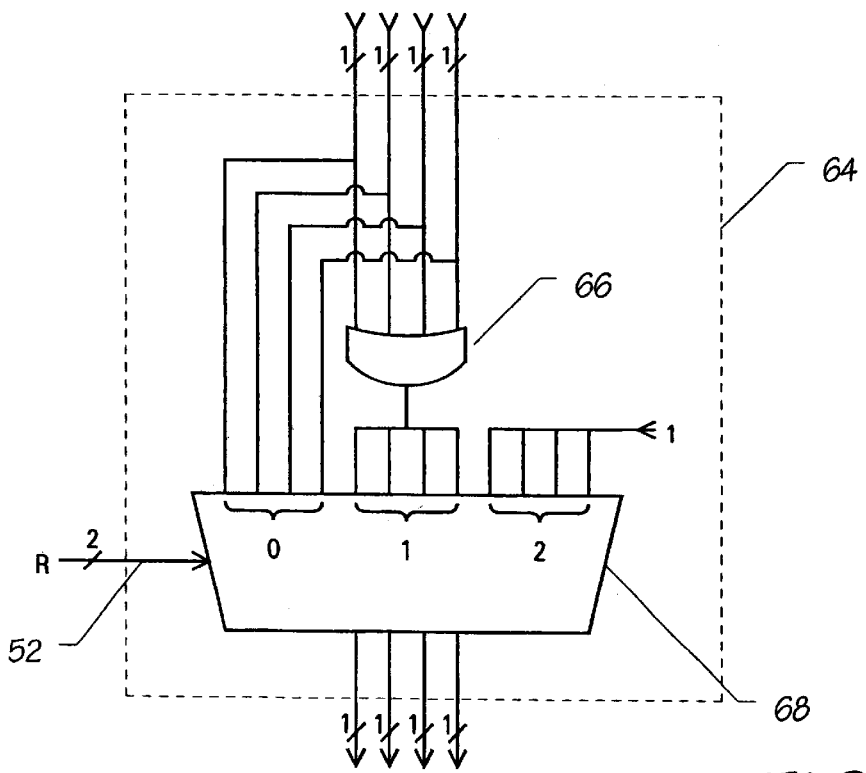
FIG. 19 shows in greater detail part of the circuit of FIG. 18.

The logic circuit 56 is shown in greater detail in FIG. 18. It comprises sixteen multiplexing logic circuits 64, each of which receives the 2-bit resolution signal R on bus 52, together with a respective ordered group of four bits of the 64-bit value B. As shown in more detail in FIG. 19, each multiplexing logic circuit 64 comprises a 4-bit OR gate 66 and a 3×4-bit to 4-bit multiplexer 68. When the resolution signal has a value R=0 (indicating single-line addressing), each of the output bits corresponds to a respective one of the input bits. When the resolution signal has a value R=1 (indicating 16-line addressing), each of the output bits corresponds to the logical OR of the input bits. Furthermore, when the resolution signal has a value R=2 (indicating 256-line addressing), each of the output bits is at logic level 1.

From the above description of FIGS. 14 to 19, it will be appreciated that the circuit functions in an identical way to the multi-line addressing embodiment described with reference to FIG. 13.

In summary, the embodiments of the invention described above demonstrate:

the removal of an unnecessary restriction on the way in which the display lines may be connected to the driver lines so as the increase the ratio N/n of the possible number of display lines to the number of driver lines without any increase in the crosstalk ratio v/c;

the use of additional connections to each display line so as to increase the ratio N/n of the possible number of display lines to the number of driver lines, albeit possibly with an increase in the crosstalk ratio v/c;

the ability to choose the number c of connections to each display line and the overlap number v substantially independently of each other, so as to achieve a required crosstalk ratio v/c;

the ability to apply constant weight code techniques to the field of display technology;

the availability of fast and compact activation pattern generation methods for some solutions which is well suited to low-cost real-time hardware or programmed computer implementation; and multi-line addressing in certain cases.

Many modifications and developments to the embodiments and examples described above will be apparent without departing from the invention.

What is claimed is:

1. A decoder system, comprising:

an address input for receiving an address signal representing any of a plurality of address values (D);

a plurality of intermediate nodes;

a decoder responsive to the address signal and arranged to stimulate, for each address value, a respective combination of the intermediate nodes; and a plurality of outputs, each responsive to a respective group of the intermediate nodes such that the stimulation applied to that output is dependent upon the stimulation applied by the decoder to each of the intermediate nodes in the respective group; wherein the decoder is arranged to perform a plural-stage process in determining which of the intermediate nodes to stimulate in response to each address value, said plural-stage process comprising at least a first stage in which results are determined and a second stage for which the results of the first stage are provided as inputs, wherein the plural-stage process comprises the determination of a word of a predetermined constant weight code;

mapping or representing the address value in accordance with a mathematical structure;

performing one or more operations in the mathematical structure to provide results equivalent to generation of a word of a constant weight code; and mapping or representing the results from the mathematical structure as a selection of intermediate nodes.

2. A system as claimed in claim 1, wherein the decoder comprises a microprocessor which is programmed to perform the plural-stage process.

3. A system as claimed in claim 1, wherein the decoder comprises hard-wired logic circuitry and/or arithmetic circuitry and/or look-up circuitry arranged to perform the plural-stage process.

4. A system as claimed in claim 1, wherein the mathematical structure is a finite affine geometry.

5. A system as claimed in claim 1, wherein the mathematical structure is a finite projective geometry.

6. A system as claimed in claim 1, wherein the mathematical structure is a difference family and the one or more operations comprise arithmetic operations with sets of elements from a group.

7. A system as claimed in claim 1, wherein the mathematical structure is chosen such that that the one or more operations are in accordance with a concatenation scheme.

8. A system as claimed in claim 1, wherein, in response to each address value, a respective single one of the outputs is stimulated, or stimulated beyond a predetermined threshold.

9. A decoder system, comprising:

an address input for receiving an address signal representing any of a plurality of address values (D);

a plurality of intermediate nodes;

a decoder responsive to the address signal and arranged to stimulate, for each address value, a respective combination of the intermediate nodes; and a plurality of outputs, each responsive to a respective group of the intermediate nodes such that the stimulation applied to that output is dependent upon the stimulation applied by the decoder to each of the intermediate nodes in the respective group; wherein the decoder is arranged to perform a plural-stage process in determining which of the intermediate nodes to stimulate in response to each address value, said plural-stage process comprising at least a first stage in which results are determined and a second stage for which the results of the first stage are provided as inputs, further including a resolution input for receiving a resolution signal representing any of a plurality of resolution values, and wherein the decoder is responsive to the resolution signal such that:

when the resolution signal has a first value, the combination of intermediate nodes stimulated in response to each address value causes a first number of the outputs to be stimulated, or to be stimulated beyond a predetermined threshold; and when the resolution signal has a second value, the combination of intermediate nodes stimulated in response to each address value causes a group of a second number of the outputs, greater than said first number, to be stimulated, or to be stimulated beyond the threshold.

10. A system as claimed in claim 9, wherein the decoder is responsive to the resolution signal such that when the resolution signal has at least one further value, the combination of intermediate nodes stimulated in response to each address value causes a, or a respective, group of a further number of the outputs, greater than said first number or said second number, to be stimulated, or to be stimulated beyond the threshold.

11. A system as claimed in claim 10, wherein the or each further different number is an integer multiple of said second number.

12. A system as claimed in claim 11, wherein each group, when the resolution signal has said one further value, is a union of a predetermined number of the groups when the resolution signal has said second value.

13. A system as claimed in claim 12, wherein the or each further different number is an integer multiple of said first number.

14. A system as claimed in claim 13, wherein each group, when the resolution signal has said one further value, is a union of a predetermined number of the groups when the resolution signal has said first value.

15. A system as claimed in claim 9, wherein said first number is one.

16. A system as claimed in claim 9, wherein the arrangement is such that the outputs which are so stimulated in response to each address value when the resolution signal has said second value are physically grouped adjacent each other.

17. A system as claimed in claim 9 wherein, in response to each address value, all of the outputs not stimulated beyond the determined threshold are also not stimulated beyond a second determined threshold, lower than the determined threshold.

18. A method of manufacturing a decoder system having the following elements:

an address input for receiving an address signal representing any of a plurality of address values (D);

a plurality of intermediate nodes;

a decoder responsive to the address signal and arranged to stimulate, for each address value, a respective combination of the intermediate nodes; and a plurality of outputs, each responsive to a respective group of the intermediate nodes such that the stimulation applied to that output is dependent upon the stimulation applied by the decoder to each of the intermediate nodes in the respective group, wherein the decoder is arranged to perform a plural-stage process in determining which of the intermediate nodes to stimulate in response to each address value, said plural-stage process comprising at least a first stage in which results are determined and a second stage for which the results of the first stage are provided as inputs;

wherein the method of manufacturing comprises the steps of:

providing such a decoder which is:
 responsive to an address signal representing any of a plurality of address values; and
 arranged to stimulate, for each address value, a respective combination of intermediate nodes;

providing a plurality of outputs;

determining, for each output, a respective group of the intermediate nodes to which that output is to be responsive; and rendering each output responsive to the intermediate nodes in the respective determined group such that the stimulation applied to that output is dependent upon the stimulation applied by the decoder to each of the intermediate nodes in the respective group;

characterised by the steps of:

determining a plural-stage process to be performed by a decoder, said plural-stage process comprising at least a first stage in which results are determined and a second stage for which the results of the first stage are provided as inputs;

arranging the decoder to perform the determined plural-stage process in determining which of the intermediate nodes to stimulate in response to each address value; and using the determined plural-stage process in said step of determining the group of the intermediate nodes to which the outputs are to be responsive; wherein the steps of providing such a decoder which is responsive to an address signal representing any of a plurality of address values and arranged to stimulate, for each address value, a respective combination of intermediate nodes, and of determining, for each output, a respective group of the intermediate nodes to which that output is to be responsive are achieved by determination of a constant weight code, wherein words of said constant weight code are used for determining respective combinations of intermediate nodes for each address value, wherein the plural-stage process performed by the decoder comprises the determination of a word of a predetermined constant weight code.

19. A method as claimed in claim 18, wherein the constant weight code is derived through mapping of address values into an affine geometry.

20. A method as claimed in claim 18, wherein the constant weight code is derived through mapping of address values into a projective geometery.

21. A method as claimed in claim 18, wherein the constant weight code is derived through representing the address values as the translates of the sets of a difference family.

22. A method as claimed in claim 18, wherein the constant weight code is derived through the method of concatenation of codes with the address values determining particular codewords used in the concatenation.

* * * * *

UNITED STATES PATENT AND TRADEMARK OFFICE
CERTIFICATE OF CORRECTION

PATENT NO. : 6,697,075 B1  
DATED : February 24, 2004  
INVENTOR(S) : Kenneth Graham Paterson Page 1 of 1

It is certified that error appears in the above-identified patent and that said Letters Patent is hereby corrected as shown below:

<u>Column 39,</u>
Line 59, change from "claim 12" to -- claim 10 --.

Signed and Sealed this

Seventeenth Day of May, 2005

JON W. DUDAS
*Director of the United States Patent and Trademark Office*